(12) United States Patent
Nishiwaki et al.

(10) Patent No.: US 11,239,357 B2
(45) Date of Patent: Feb. 1, 2022

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Tatsuya Nishiwaki, Komatsu (JP); Hiroaki Katou, Nonoichi (JP); Kenya Kobayashi, Nonoichi (JP); Tsuyoshi Kachi, Nonoichi (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/780,965

(22) Filed: Feb. 4, 2020

(65) Prior Publication Data

US 2021/0057574 A1 Feb. 25, 2021

(30) Foreign Application Priority Data

Aug. 23, 2019 (JP) .............................. JP2019-152717

(51) Int. Cl.
*H01L 29/78* (2006.01)
*H01L 29/06* (2006.01)
(Continued)

(52) U.S. Cl.
CPC ........ *H01L 29/7813* (2013.01); *H01L 23/535* (2013.01); *H01L 29/0696* (2013.01); *H01L 29/407* (2013.01)

(58) Field of Classification Search
CPC ............. H01L 29/7813; H01L 29/0696; H01L 29/407; H01L 29/7827; H01L 29/4236;
(Continued)

(56) References Cited

U.S. PATENT DOCUMENTS 7,741,675 B2 * 6/2010 Hirler ................. H01L 29/7813
257/330
9,142,555 B2 9/2015 Yoshida et al.
(Continued)

FOREIGN PATENT DOCUMENTS

| JP | 2013-16708 A | 1/2013 |
| JP | 2016-167519 A | 9/2016 |
| JP | 2018-50048 A | 3/2018 |

*Primary Examiner* — Galina G Yushina
(74) *Attorney, Agent, or Firm* — Oblon, McClelland, Maier & Neustadt, L.L.P.

(57) ABSTRACT

According to one embodiment, a semiconductor device includes a first electrode, a first semiconductor region, a second semiconductor region, a third semiconductor region, a metal-including portion being conductive, an insulating portion, a gate electrode, a second electrode, a first interconnect layer, and a second interconnect layer. The first semiconductor region is provided on the first electrode. The second semiconductor region is provided on the first semiconductor region. The third semiconductor region and the metal-including portion are provided on portions of the second semiconductor region. The insulating portion is arranged in a second direction with the third semiconductor region, the second semiconductor region, and a portion of the first semiconductor region. The gate electrode and the second electrode are provided inside the insulating portion. The first interconnect layer is electrically connected to the gate electrode. The second interconnect layer is electrically connected to the metal-including portion and the second electrode.

13 Claims, 18 Drawing Sheets

(51) Int. Cl.
*H01L 23/535* (2006.01)
*H01L 29/40* (2006.01)

(58) Field of Classification Search
CPC ........... H01L 29/7802; H01L 29/78642; H01L 23/535; H01L 23/481; H01L 23/48; H01L 27/088
See application file for complete search history.

(56) References Cited

U.S. PATENT DOCUMENTS

| | | |
|---|---|---|
| 9,917,183 B2 | 3/2018 | Arai et al. |
| 2013/0009241 A1 | 1/2013 | Matsuda |
| 2014/0048904 A1* | 2/2014 | Zundel ................ H01L 29/4236 257/499 |
| 2014/0077278 A1* | 3/2014 | Nozu ................ H01L 29/66477 257/288 |
| 2014/0217495 A1* | 8/2014 | Wutte ................... H01L 29/407 257/328 |
| 2016/0268420 A1* | 9/2016 | Arai .................. H01L 29/66734 |
| 2018/0240867 A1* | 8/2018 | Nitta ................. H01L 23/53261 |
| 2018/0301553 A1* | 10/2018 | Weyers ............... H01L 27/0255 |
| 2019/0348510 A1* | 11/2019 | Yilmaz ............... H01L 29/0696 |

* cited by examiner

SEMICONDUCTOR DEVICE

CROSS-REFERENCE TO RELATED APPLICATIONS

This application is based upon and claims the benefit of priority from Japanese Patent Application No. 2019-152717, filed on Aug. 23, 2019; the entire contents of which are incorporated herein by reference.

FIELD

Embodiments described herein relate generally to a semiconductor device.

BACKGROUND

There is a semiconductor device that includes a field plate electrode (hereinbelow, called a FP electrode) to increase the breakdown voltage. It is desirable to improve the avalanche capability of the semiconductor device.

DETAILED DESCRIPTION

Figure 1:
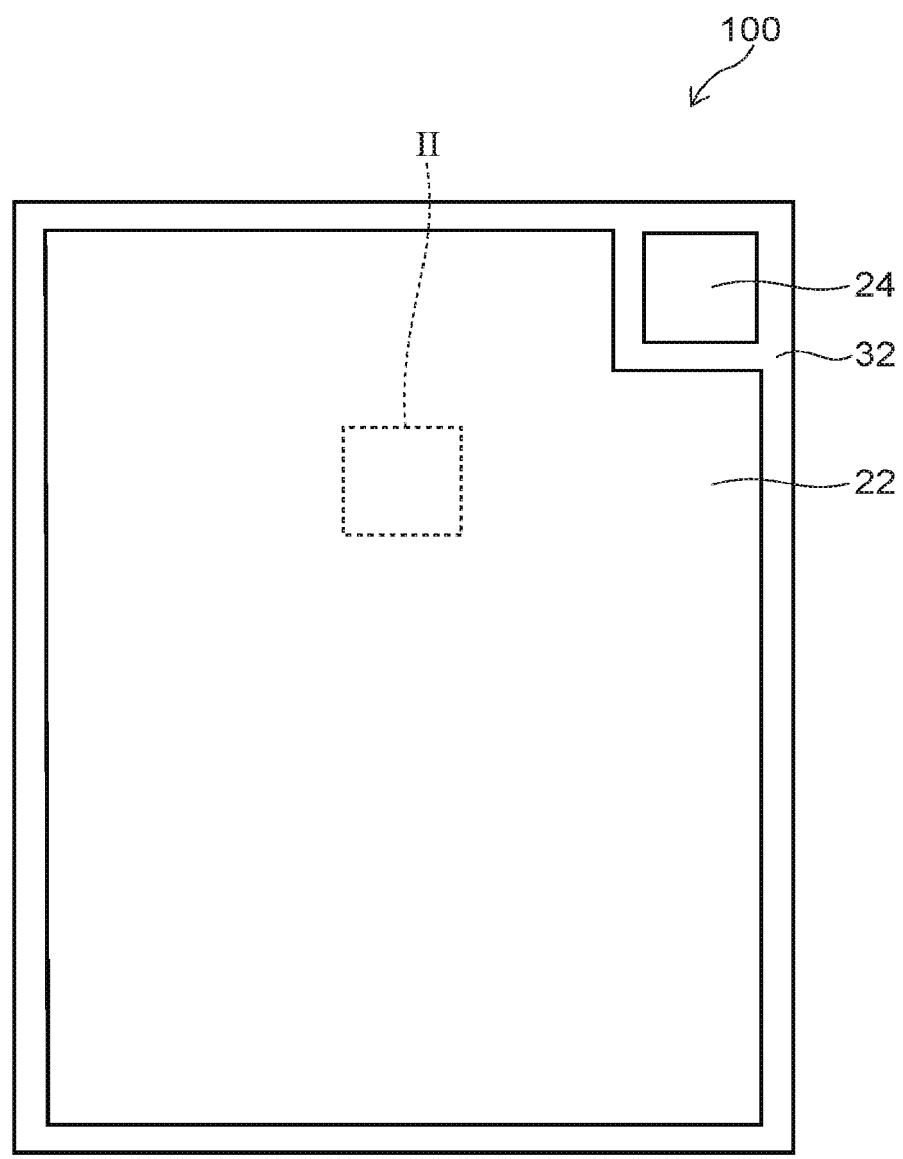
FIG. 1 is a plan view illustrating a semiconductor device according to a first embodiment.
Figure 1:
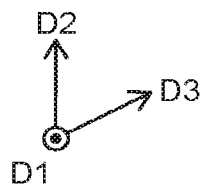

According to one embodiment, a semiconductor device includes a first electrode, a first semiconductor region of a first conductivity type, a second semiconductor region of a second conductivity type, a third semiconductor region of the first conductivity type, a metal-including portion being conductive, an insulating portion, a gate electrode, a second electrode, a first interconnect layer, and a second interconnect layer. The first semiconductor region is provided on the first electrode and electrically connected to the first electrode. The second semiconductor region is provided on the first semiconductor region. The third semiconductor region is provided on a portion of the second semiconductor region. The metal-including portion is provided on an other portion of the second semiconductor region. The insulating portion is arranged in a second direction with the third semiconductor region, the second semiconductor region, and a portion of the first semiconductor region. The second direction is perpendicular to a first direction from the first electrode toward the first semiconductor region. The gate electrode is provided inside the insulating portion, and opposes the second semiconductor region in the second direction with a gate insulating layer interposed. The second electrode is provided inside the insulating portion and electrically isolated from the gate electrode. The second electrode includes a portion opposing the first semiconductor region in the second direction. The first interconnect layer is electrically connected to the gate electrode and provided, with a first insulating layer interposed, on the gate electrode and a portion of the metal-including portion. The second interconnect layer is provided to be separated from the first interconnect layer and electrically connected to the metal-including portion and the second electrode.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the drawings and the description recited below, the notations of n$^+$, n$^-$, and p indicate relative levels of the impurity concentrations. In other words, a notation marked with "+" indicates that the impurity concentration is relatively higher than that of a notation not marked with either "+" or "−;" and a notation marked with "−" indicates that the impurity concentration is relatively lower than that of a notation without any mark. In the case where both a p-type impurity and an n-type impurity are included in each region, these notations indicate relative levels of the net impurity concentrations after the impurities are compensated.

In the embodiments described below, each embodiment may be performed by inverting the p-type and the n-type of each semiconductor region.

First Embodiment

FIG. 1 is a plan view illustrating a semiconductor device according to a first embodiment.

Figure 2:
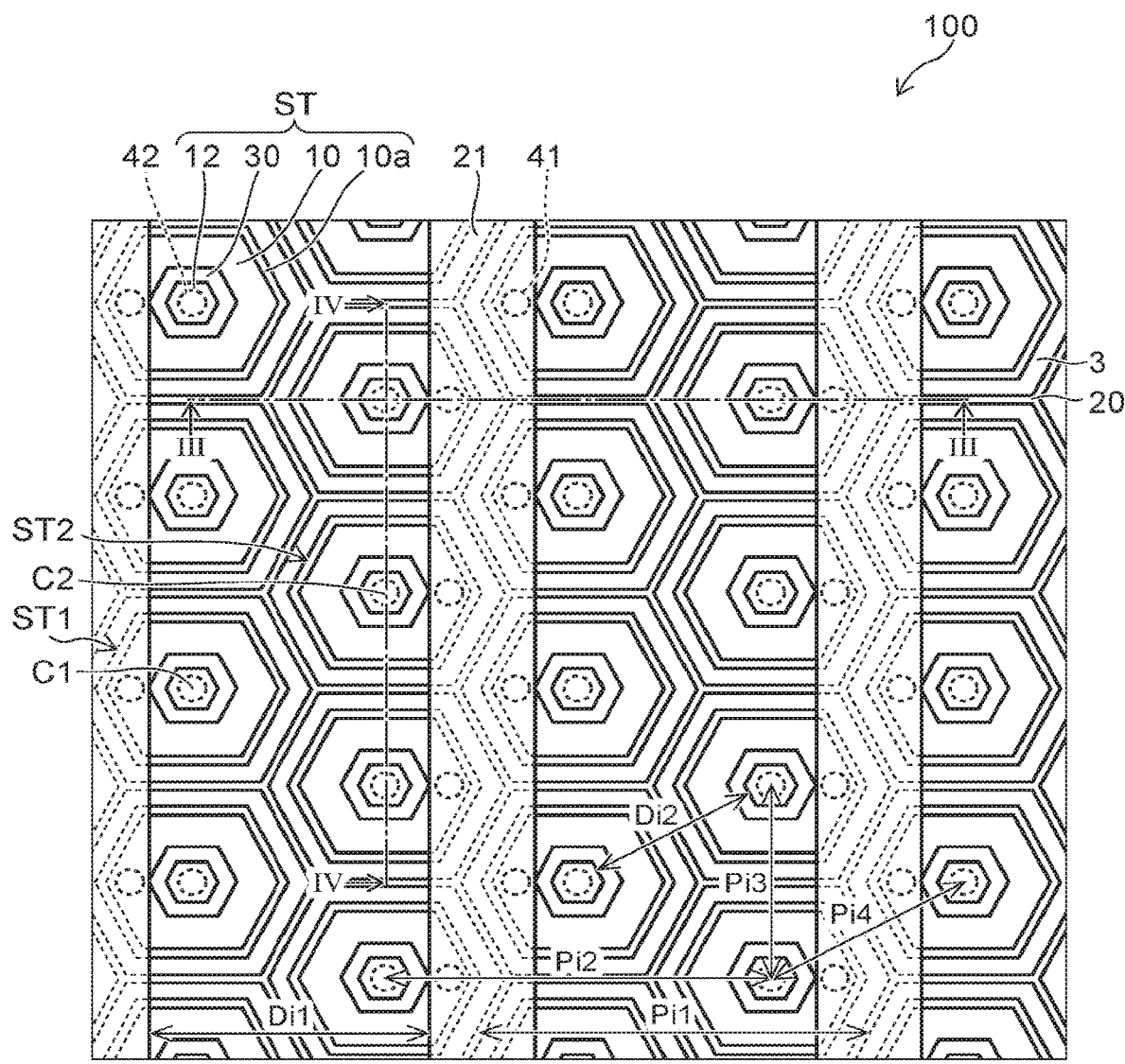
FIG. 2 is a plan view illustrating portion II of FIG. 1.

FIG. 2 is a plan view illustrating portion II of FIG. 1. An n$^+$-type source region 3, a source pad 22, a first insulating layer 31, a second insulating layer 32, and a second connector 42 are not illustrated in FIG. 2.

Figure 3:
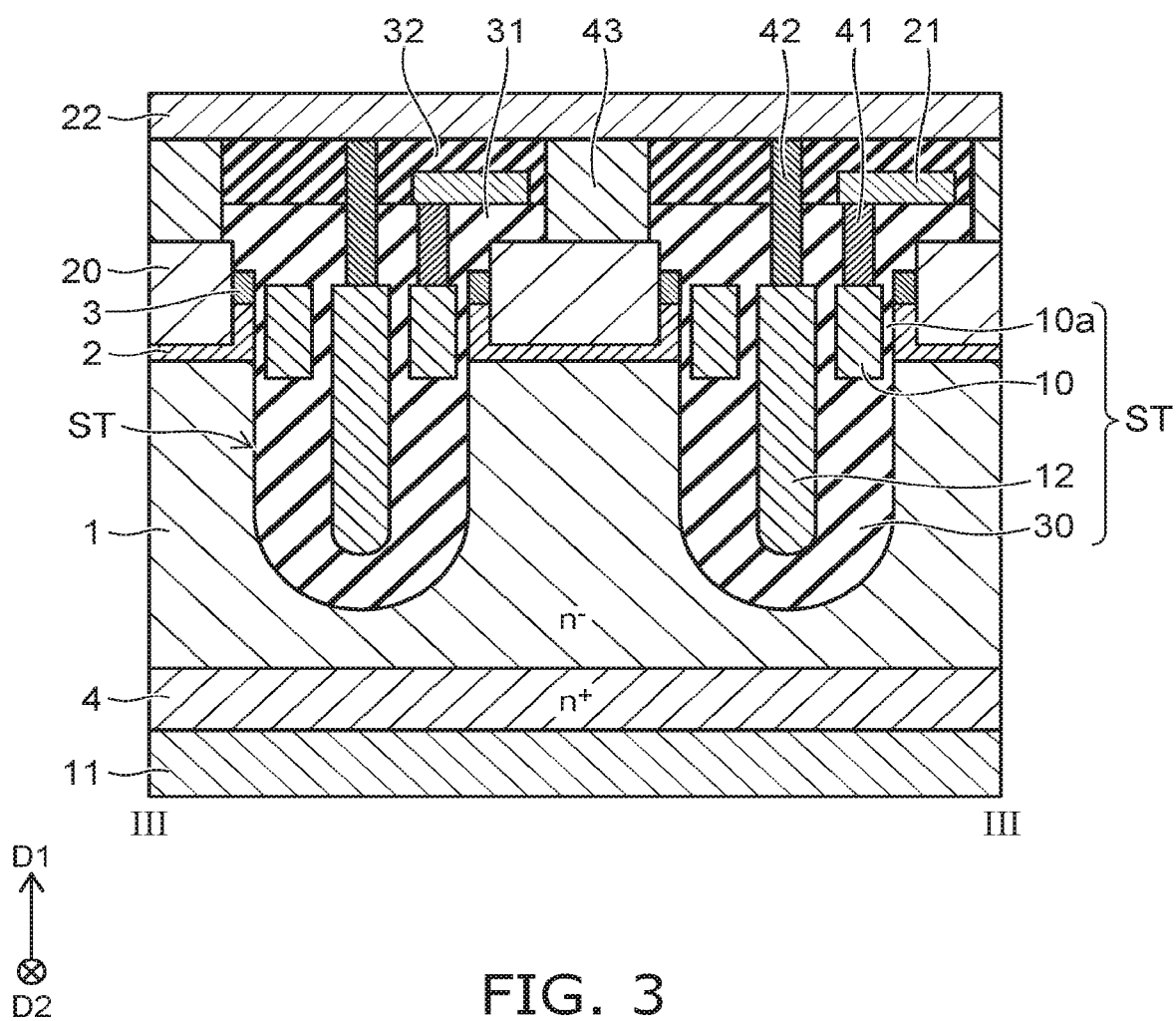
FIG. 3 is a III-III cross-sectional view of FIG. 2.
Figure 4:
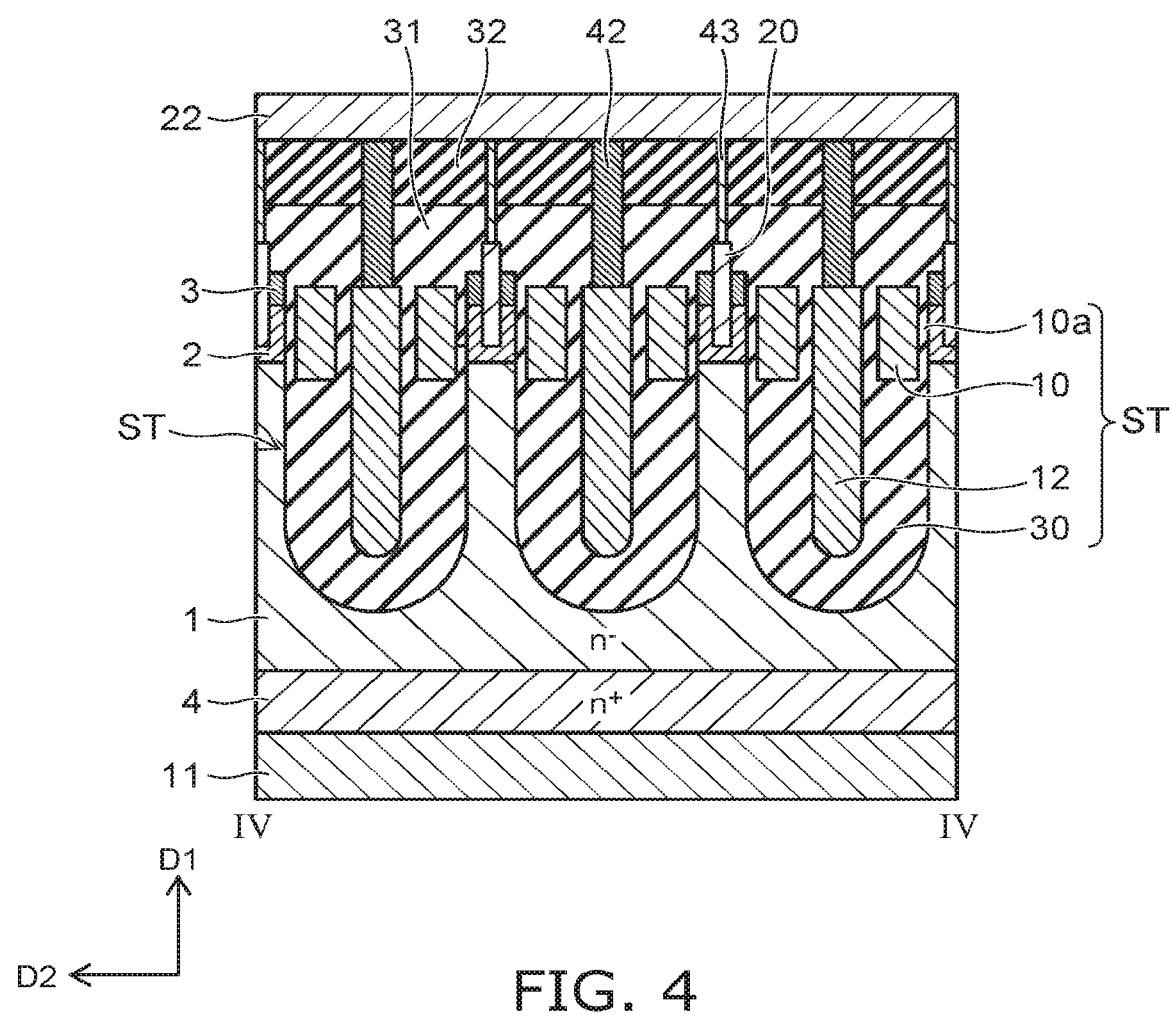
FIG. 4 is a IV-IV cross-sectional view of FIG. 2.

FIG. 3 is a III-III cross-sectional view of FIG. 2. FIG. 4 is a IV-IV cross-sectional view of FIG. 2.

The semiconductor device 100 according to the first embodiment is, for example, a MOSFET. As illustrated in FIG. 1 to FIG. 4, the semiconductor device 100 according to the first embodiment includes an n⁻-type drift region 1 (a first semiconductor region), a p-type base region 2 (a second semiconductor region), the n⁺-type source region 3 (a third semiconductor region), an n⁺-type drain region 4, a gate electrode 10, a drain electrode 11 (a first electrode), a FP electrode 12 (a second electrode), a metal-including portion 20, a gate interconnect layer 21 (a first interconnect layer), the source pad 22 (a second interconnect layer), a gate pad 24, an insulating portion 30, the first insulating layer 31, the second insulating layer 32, a first connector 41, the second connector 42, and a third connector 43.

A first direction D1, a second direction D2, and a third direction D3 are used in the description of the embodiments. The direction from the drain electrode 11 toward the n⁻-type drift region 1 is taken as the first direction D1. One direction perpendicular to the first direction D1 is taken as the second direction D2. A direction that is perpendicular to the first direction D1 and crosses the second direction D2 is taken as the third direction D3. For the description, the direction from the drain electrode 11 toward the n⁻-type drift region 1 is called "up;" and the reverse direction is called "down." These directions are based on the relative positional relationship between the drain electrode 11 and the n⁻-type drift region 1 and are independent of the direction of gravity.

As illustrated in FIG. 1, the source pad 22 and the gate pad 24 are provided at the upper surface of the semiconductor device 100. The source pad 22 and the gate pad 24 are electrically isolated from each other.

As illustrated in FIG. 3 and FIG. 4, the drain electrode 11 is provided at the lower surface of the semiconductor device 100. The n⁻-type drift region 1 is provided on the drain electrode 11 with the n⁺-type drain region 4 interposed. The n⁻-type drift region 1 is electrically connected to the drain electrode 11 via the n⁺-type drain region 4. The p-type base region 2 is provided on the n⁻-type drift region 1. The n⁺-type source region 3 is provided on a portion of the p-type base region 2. The metal-including portion 20 is conductive and is provided on another portion of the p-type base region 2. For example, the lower surface of the metal-including portion 20 is positioned lower than the lower surface of the n⁺-type source region 3.

The insulating portion 30 is arranged in the second direction D2 with the n⁺-type source region 3, the p-type base region 2, and a portion of the n⁻-type drift region 1. The gate electrode 10 and the FP electrode 12 are provided inside the insulating portion 30. The gate electrode 10 opposes the p-type base region 2 in the second direction D2 and the third direction D3 with a gate insulating layer 10a, which is a portion of the insulating portion 30, interposed. In the semiconductor device 100, the gate electrode 10 also opposes a portion of the n⁻-type drift region 1 and a portion of the n⁺-type source region 3 with the gate insulating layer 10a interposed.

A portion of the FP electrode 12 opposes the n⁻-type drift region 1 in the second direction D2 and the third direction D3. Another portion of the FP electrode 12 opposes the gate electrode 10 in the second direction D2 and the third direction D3. A portion of the insulating portion 30 is provided between the gate electrode 10 and the FP electrode 12. Thereby, the gate electrode 10 and the FP electrode 12 are electrically isolated from each other.

As illustrated in FIG. 3, the gate interconnect layer 21 is provided on the gate electrode 10 and a portion of the metal-including portion 20 with the first insulating layer 31 interposed. For example, the upper surface of the portion of the metal-including portion 20 is positioned higher than the upper surface of the n⁺-type source region 3. The first connector 41 is provided between the gate electrode 10 and the gate interconnect layer 21 and electrically connects the gate electrode 10 and the gate interconnect layer 21.

The source pad 22 is provided on the gate interconnect layer 21 with the second insulating layer 32 interposed. The second connector 42 is provided between the FP electrode 12 and the source pad 22 and electrically connects the FP electrode 12 and the source pad 22. The third connector 43 is provided between the source pad 22 and another portion of the metal-including portion 20 and electrically connects the metal-including portion 20 and the source pad 22. In other words, the third connector 43 electrically connects the metal-including portion 20 and the source pad 22 at a position where the gate interconnect layer 21 is not provided.

For example, the gate pad 24 is provided on the second insulating layer 32 and is separated from the source pad 22. The gate interconnect layer 21 and the gate pad 24 are electrically connected to each other by a not-illustrated connector piercing the second insulating layer 32. Or, the gate pad 24 may be provided on the first insulating layer 31. In such a case, the gate pad 24 is positioned lower than the source pad 22.

In the semiconductor device 100 as illustrated in FIG. 2, pluralities are provided in the second direction D2 and the third direction D3 for the gate electrode 10, the FP electrode 12, and the insulating portion 30. When viewed from the first direction D1, the gate electrode 10 has a ring configuration. The FP electrode 12 is positioned inside the gate electrode 10. The p-type base region 2, the n⁺-type source region 3, and the metal-including portion 20 are provided around each of the insulating portions 30 in the second direction D2 and the third direction D3. Multiple gate interconnect layers 21 are provided in the third direction D3; and the gate interconnect layers 21 extend in the second direction D2. Each of the gate interconnect layers 21 is provided on the gate electrodes 10 arranged in the second direction D2 and is electrically connected to the gate electrodes 10 arranged in the second direction D2. As illustrated in FIG. 3, the source pad 22 is provided on the multiple gate interconnect layers 21 with the second insulating layer 32 interposed.

Operations of the semiconductor device 100 will now be described.

A voltage that is higher than a threshold is applied to the gate electrode 10 in a state in which a voltage that is positive with respect to the source pad 22 is applied to the drain electrode 11. Thereby, a channel (an inversion layer) is formed in the p-type base region 2; and the semiconductor device 100 is set to the ON-state. Electrons flow from the source pad 22 toward the drain electrode 11 via the channel. Subsequently, when the voltage applied to the gate electrode 10 becomes lower than the threshold, the channel in the p-type base region 2 disappears; and the semiconductor device 100 is set to the OFF-state.

When the semiconductor device 100 is switched to the OFF-state, the voltage that is positive with respect to the source pad 22 and is applied to the drain electrode 11 increases. Due to the increase of the positive voltage, a depletion layer spreads toward the n⁻-type drift region 1 from the interface between the insulating portion 30 and the n⁻-type drift region 1. Due to the spreading of the depletion layer, the breakdown voltage of the semiconductor device 100 can be increased. Or, the ON-resistance of the semiconductor device 100 can be reduced by increasing the n-type impurity concentration in the n⁻-type drift region 1 while maintaining the breakdown voltage of the semiconductor device 100.

When the depletion layer spreads in the n⁻-type drift region 1, avalanche breakdown occurs due to the electrons accelerated inside the depletion layer. Carriers (electrons and holes) are generated when avalanche breakdown occurs. At this time, the electrons pass through the n⁺-type drain region 4 and are discharged from the drain electrode 11. The holes pass through the third connector 43 and are discharged toward the source pad 22.

Examples of the materials of the components of the semiconductor device 100 will now be described.

The n⁻-type drift region 1, the p-type base region 2, the n⁺-type source region 3, and the n⁺-type drain region 4 include silicon, silicon carbide, gallium nitride, or gallium arsenide as semiconductor materials. In the case where silicon is used as the semiconductor material, arsenic, phosphorus, or antimony can be used as an n-type impurity. Boron can be used as a p-type impurity.

The gate electrode 10 and the FP electrode 12 include a conductive material such as polysilicon, etc. An impurity may be added to the conductive material.

The insulating portion 30, the first insulating layer 31, and the second insulating layer 32 include an insulating material such as silicon oxide, silicon nitride, etc.

The drain electrode 11, the gate interconnect layer 21, the source pad 22, and the gate pad 24 include a metal such as aluminum, copper, etc.

The metal-including portion 20 includes at least one metal selected from the group consisting of aluminum, tungsten, copper, titanium, cobalt, and nickel. The metal-including portion 20 may include a compound of the metals. For example, the metal-including portion 20 may include a compound (a silicide) of silicon and at least one metal selected from the group consisting of titanium, cobalt, and nickel.

The first connector 41, the second connector 42, and the third connector 43 include a metal such as tungsten, copper, etc.

An example of a method for manufacturing the semiconductor device 100 according to the embodiment will now be described.

FIG. 5A to FIG. 8B are process cross-sectional views illustrating manufacturing processes of the semiconductor device according to the first embodiment. FIG. 5A to FIG. 8B illustrate the manufacturing processes at a cross section parallel to the first direction D1 and the second direction D2.

Figure 5A:
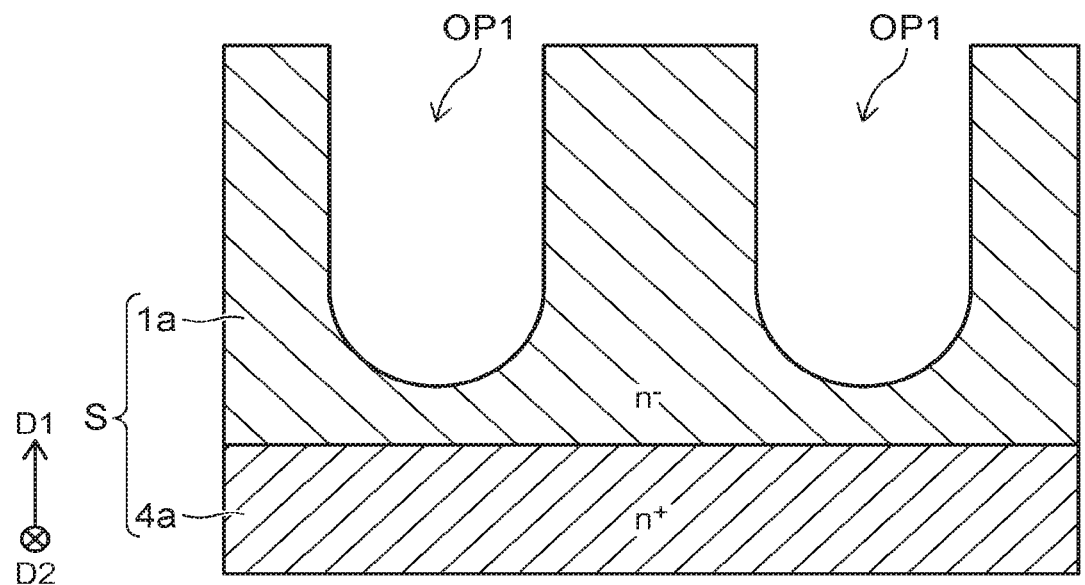
FIGS. 5A and 5B are process cross-sectional views illustrating manufacturing processes of the semiconductor device according to the first embodiment.

A semiconductor substrate S which includes an n⁺-type semiconductor layer 4a and an n⁻-type semiconductor layer 1a is prepared. As illustrated in FIG. 5A, openings OP1 are formed by removing a portion of the n⁻-type semiconductor layer 1a. Multiple openings OP1 are formed in the second direction D2 and the third direction D3.

Figure 5B:
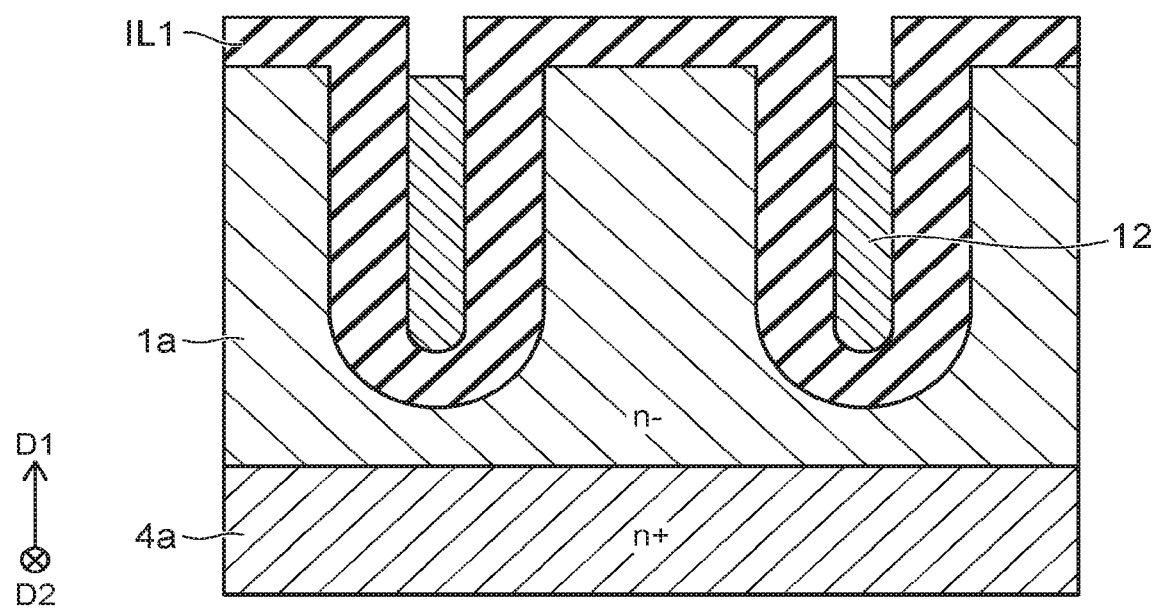

An insulating layer IL1 is formed along the inner surfaces of the multiple openings OP1 and the upper surface of the n⁻-type semiconductor layer 1a by thermal oxidation. A conductive layer that fills the multiple openings OP1 is formed on the insulating layer IL1. For example, the conductive layer includes polysilicon to which an impurity is added. As illustrated in FIG. 5B, the FP electrodes 12 are formed respectively inside the openings OP1 by causing the upper surface of the conductive layer to recede.

Figure 6A:
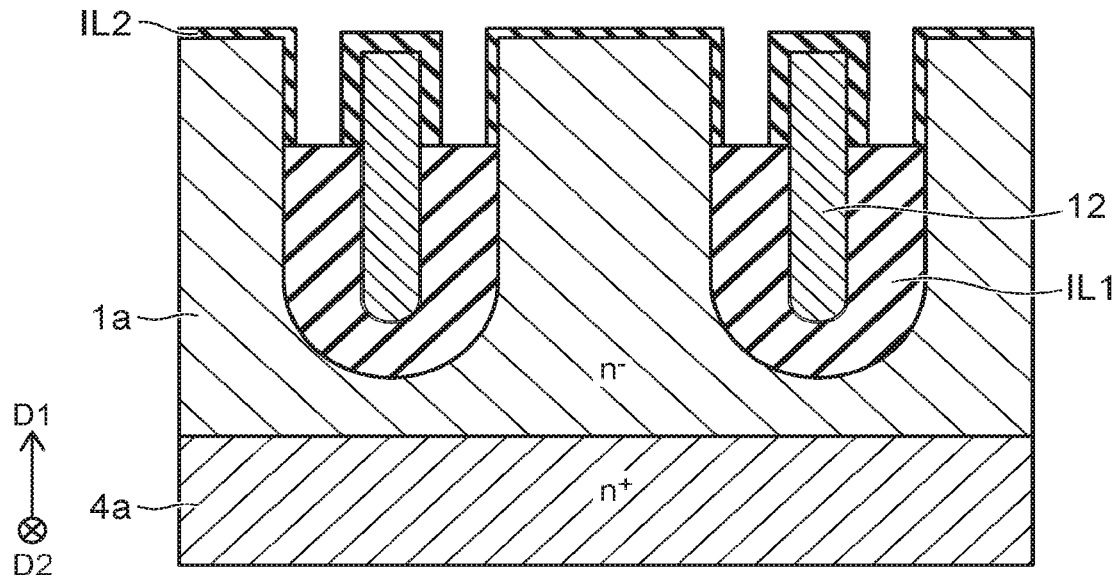
FIGS. 6A and 6B are process cross-sectional views illustrating manufacturing processes of the semiconductor device according to the first embodiment.

The insulating layer IL1 that is provided around the upper portions of the FP electrodes 12 and at the upper surface of the n⁻-type semiconductor layer 1a is removed. The upper portions of the FP electrodes 12 and the upper surface of the n⁻-type semiconductor layer 1a are exposed thereby. As illustrated in FIG. 6A, an insulating layer IL2 is formed along the exposed portions by thermal oxidation.

Figure 6B:
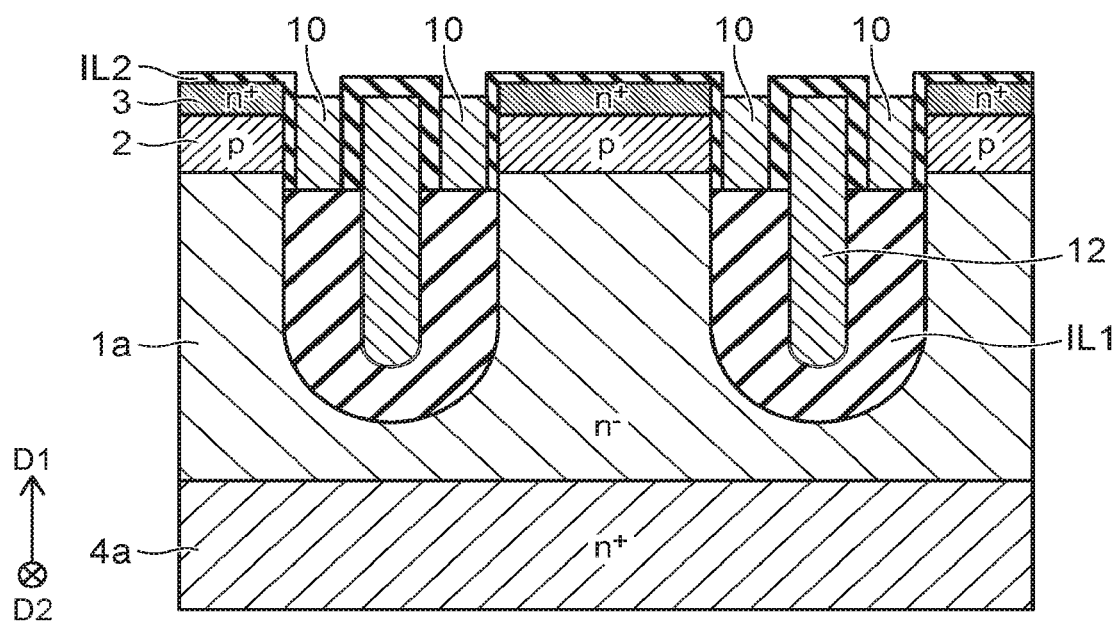

A conductive layer that includes polysilicon is formed on the insulating layer IL2; and the upper surface of the conductive layer is caused to recede. Thereby, the gate electrodes 10 are formed respectively around the upper portions of the FP electrodes 12. The p-type base region 2 is formed by ion-implanting a p-type impurity into the front surface of the n⁻-type semiconductor layer 1a. As illustrated in FIG. 6B, the n⁺-type source region 3 is formed by ion-implanting an n-type impurity into the front surface of the p-type base region 2.

Figure 7A:
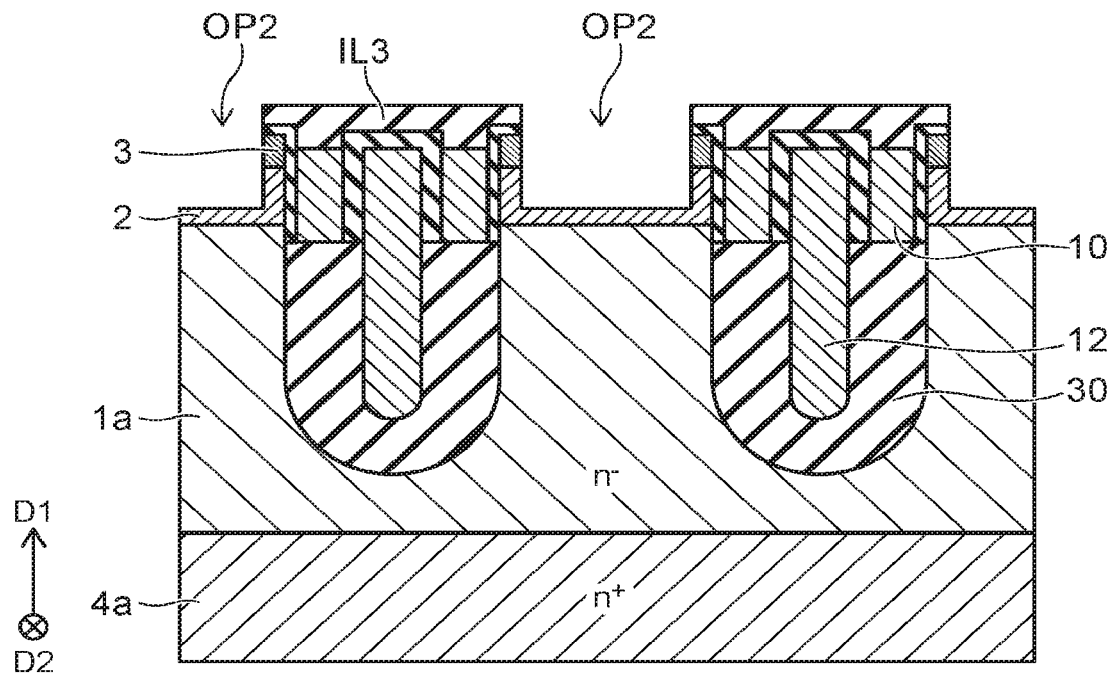
FIGS. 7A and 7B are process cross-sectional views illustrating manufacturing processes of the semiconductor device according to the first embodiment.

An insulating layer IL3 is formed on the insulating layer IL2 and the multiple gate electrodes 10; and the upper surface of the insulating layer IL3 is planarized. As illustrated in FIG. 7A, openings OP2 are formed by removing a portion of the insulating layer IL3, a portion of the insulating layer IL2, a portion of the n⁺-type source region 3, and a portion of the p-type base region 2. The openings OP2 illustrated in FIG. 7A are linked to each other by not-illustrated portions.

Figure 7B:
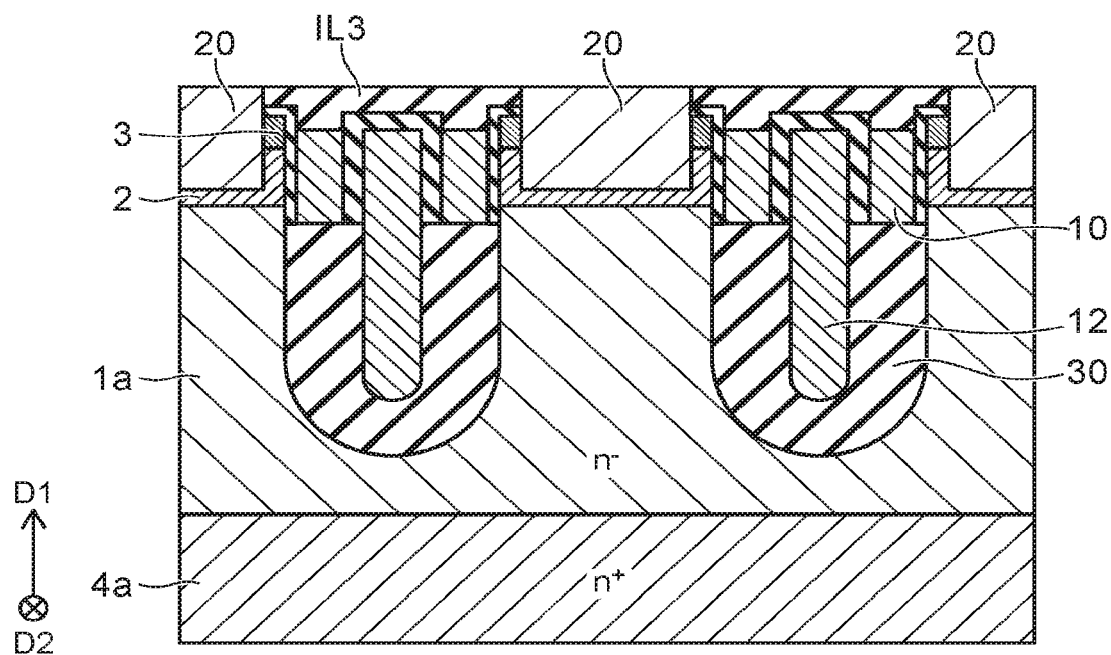

A metal layer that fills the openings OP2 is formed on the insulating layer IL3. The metal layer includes, for example, tungsten. As illustrated in FIG. 7B, the metal-including portion 20 is formed by causing the upper surface of the metal layer to recede. At this time, the position of the upper surface of the metal-including portion 20 is substantially the same as the position of the upper surface of the insulating layer IL3. In other words, the upper surface of the metal-including portion 20 is positioned higher than the upper surface of the n⁺-type source region 3.

An insulating layer IL4 is formed on the insulating layer IL3 and the metal-including portion 20; and the upper surface of the insulating layer IL4 is planarized. Multiple openings that pierce the insulating layers IL3 and IL4 and reach the gate electrodes 10 are formed. The openings are filled by forming a metal layer including tungsten. The multiple first connectors which are connected respectively to the multiple gate electrodes 10 are formed by causing the upper surface of the metal layer to recede.

Figure 8A:
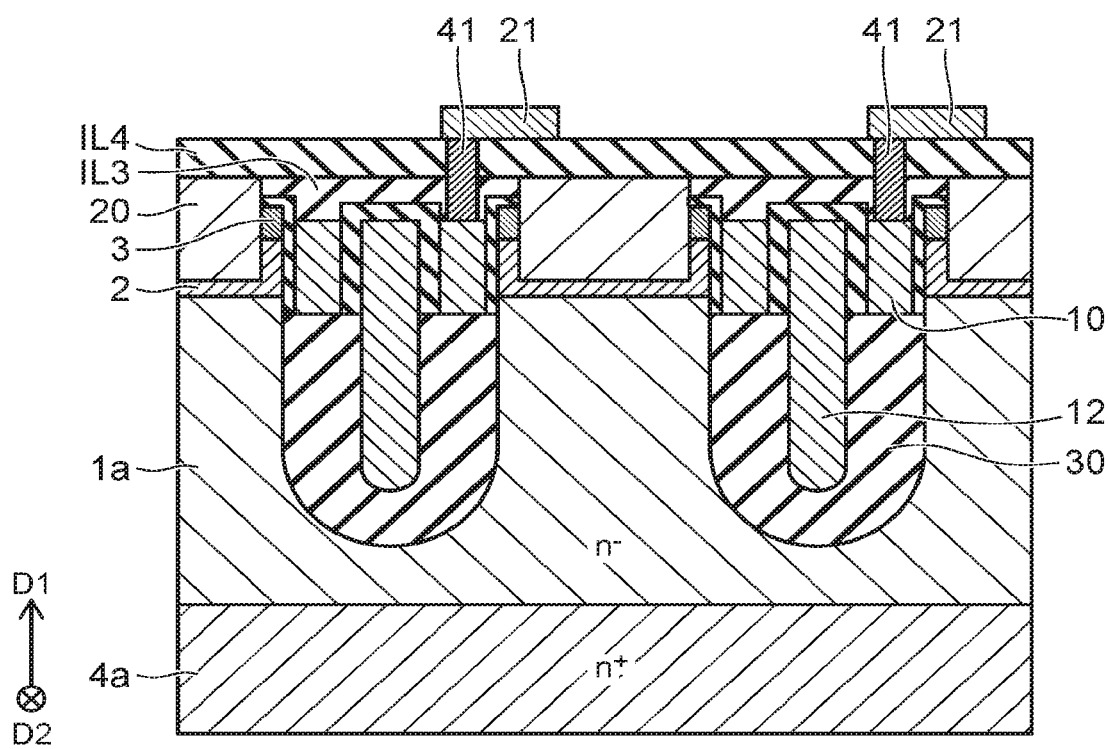
FIGS. 8A and 8B are process cross-sectional views illustrating manufacturing processes of the semiconductor device according to the first embodiment.

A metal layer that includes aluminum is formed on the insulating layer IL4 and the multiple first connectors 41; and the metal layer is patterned. Thereby, as illustrated in FIG. 8A, the gate interconnect layer 21 which is connected to the first connectors 41 is formed. At this time, a portion of the gate interconnect layer 21 is positioned on a portion of the metal-including portion 20.

An insulating layer IL5 which covers the multiple gate interconnect layers 21 is formed on the insulating layer IL4; and the upper surface of the insulating layer IL5 is planarized. Multiple openings that respectively reach the FP electrodes 12 and the metal-including portion 20 are formed by removing portions of the insulating layers IL3 to IL5. The multiple openings are formed at positions where the gate interconnect layers 21 are not provided.

Figure 8B:
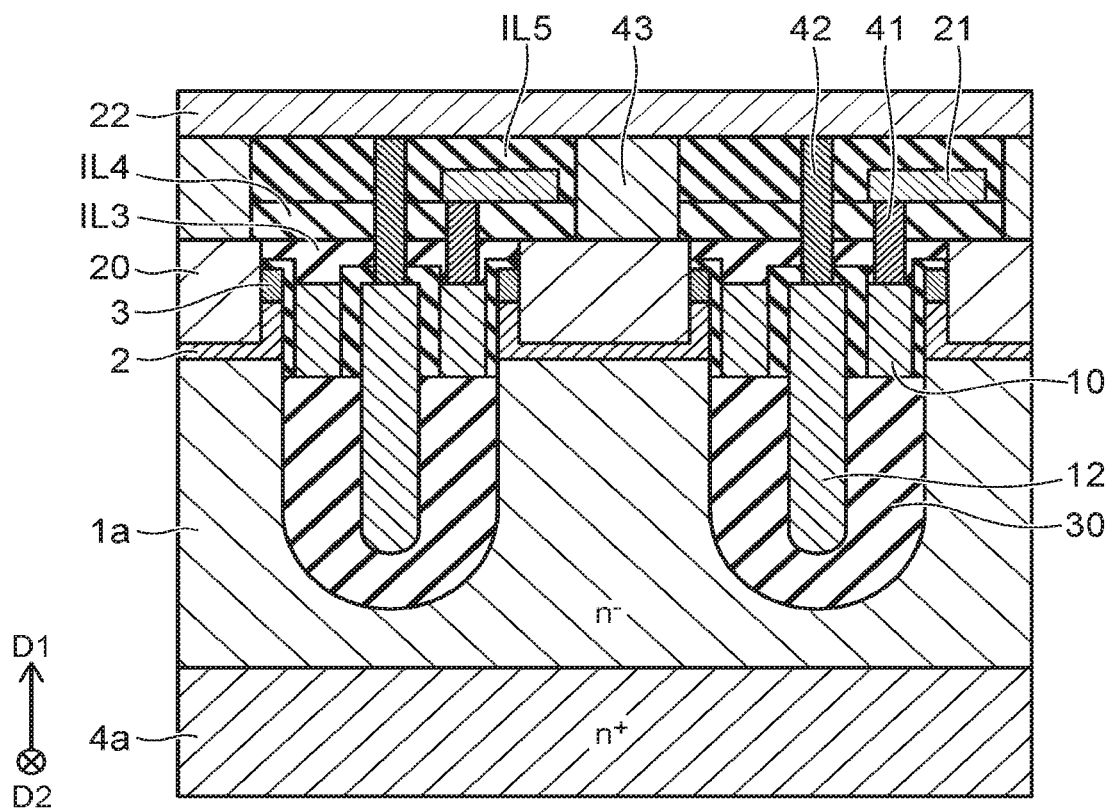

The openings are filled by forming a metal layer including tungsten. The second connectors 42 and the third connector 43 which are connected respectively to the FP electrodes 12 and the metal-including portion 20 are formed by causing the upper surface of the metal layer to recede. A metal layer that includes aluminum is formed on the insulating layer IL5; and the metal layer is patterned. Thereby, as illustrated in FIG. 8B, the source pad 22 and the not-illustrated gate pad 24 are formed. The source pad 22 is connected to the second connectors 42 and the third connectors 43.

The back surface of the n+-type semiconductor layer 4a is polished until the n+-type semiconductor layer 4a has a prescribed thickness. Subsequently, the semiconductor device 100 illustrated in FIG. 1 to FIG. 4 is manufactured by forming the drain electrode 11 at the back surface of the n+-type semiconductor layer 4a.

In the manufacturing processes described above, chemical vapor deposition (CVD) or sputtering can be used to form the components. Wet etching, chemical dry etching (CDE), or reactive ion etching (RIE) can be used to remove portions of the components. Wet etching, CDE, or chemical mechanical polishing (CMP) can be used to planarize the upper surfaces of the components or cause the upper surfaces to recede.

Effects of the first embodiment will now be described.

The semiconductor device 100 according to the first embodiment includes the FP electrode 12. By providing the FP electrode 12, the impurity concentration of the n−-type drift region 1 can be increased while maintaining the breakdown voltage of the semiconductor device 100. The ON-resistance of the semiconductor device 100 can be reduced thereby.

In the semiconductor device 100, multiple gate electrodes 10 are provided in the second direction D2 and the third direction D3. According to this structure, channels are formed at the peripheries of the gate electrodes 10 when the semiconductor device 100 is in the ON-state. Therefore, compared to the case where the gate electrode 10 extends to be continuous in one direction, the surface area of the channel per unit area can be increased; and the volume of the n−-type drift region 1 which is used as the current path can be increased. As a result, the ON-resistance of the semiconductor device 100 can be reduced further.

When the ON-resistance of the semiconductor device 100 is reduced, the current density flowing through the semiconductor device 100 can be increased. Due to the increase of the current density, the semiconductor device 100 can be downsized. Or, the number of the semiconductor devices 100 necessary for a prescribed current to flow can be reduced.

Here, the semiconductor device 100 includes a parasitic bipolar transistor (hereinbelow, called a parasitic transistor) in which the n−-type drift region 1 is the collector, the p-type base region 2 is the base, and the n+-type source region 3 is the emitter. When holes flow in the p-type base region 2, the parasitic transistor may operate when the potential of the p-type base region 2 increases. When the parasitic transistor operates, a large current flows in the semiconductor device 100; and there is a possibility that breakdown of the semiconductor device 100 may occur.

In the semiconductor device 100, multiple gate electrodes 10 are provided to be separated from each other in the second direction D2 and the third direction D3. The gate electrodes 10 are electrically connected to the gate pad 24 by the gate interconnect layers 21 provided on the gate electrodes 10. In the case of this structure as illustrated in FIG. 3, a portion of the p-type base region 2 is positioned under the gate interconnect layer 21. The third connector 43 does not exist at the position where the gate interconnect layer 21 is provided. Accordingly, the electrical resistance to the holes flowing in the p-type base region 2 under the gate interconnect layer 21 is higher than the electrical resistance to the holes flowing in the p-type base region 2 under the third connector 43. Therefore, when avalanche breakdown occurs, compared to the p-type base region 2 under the third connector 43, the voltage drop increases and the potential increases easily in the p-type base region 2 under the gate interconnect layer 21. In other words, compared to the region under the third connector 43, the parasitic transistor operates easily in the region under the gate interconnect layer 21.

In particular, a large improvement of the current density is possible by providing the FP electrode 12 and by providing the multiple gate electrodes 10 in the second direction D2 and the third direction D3. On the other hand, when the current density is increased, the amount of the carriers generated when avalanche breakdown occurs also increases. Therefore, the potential in the p-type base region 2 under the gate interconnect layer 21 easily increases further; and the likelihood of the parasitic transistor operating is higher.

For this problem, in the semiconductor device 100 according to the first embodiment, the metal-including portion 20 which is electrically connected to the source pad 22 is provided on the p-type base region 2. The metal-including portion 20 includes a metal. Therefore, the electrical resistivity of the metal-including portion 20 is lower than the electrical resistivity of the p-type base region 2. Also, as illustrated in FIG. 3, the metal-including portion 20 is provided not only under the third connector 43 but also under the gate interconnect layer 21. Not only the electrical resistance of the region under the third connector 43 but also the electrical resistance of the region under the gate interconnect layer 21 can be reduced thereby. Therefore, the electrical resistance to the holes flowing into the p-type base region 2 under the gate interconnect layer 21 until being discharged to the source pad 22 can be reduced. By reducing the electrical resistance to the holes, the increase of the potential of the p-type base region 2 when avalanche breakdown occurs can be suppressed; and the likelihood of the parasitic transistor operating can be reduced. In other words, according to the first embodiment, the avalanche capability can be improved.

Also, when the electrical resistance in the region under the gate interconnect layer 21 is reduced by the metal-including portion 20, the ON-resistance of the semiconductor device 100 also can be reduced. The current density can be increased further thereby.

The gate electrode 10 and the FP electrode 12 are provided inside one insulating portion 30. In the one insulating portion 30, a portion of the FP electrode 12 is positioned lower than the gate electrode 10. The thickness of the insulating portion 30 between the n−-type drift region 1 and the portion of the FP electrode 12 is greater than the thickness of the gate insulating layer 10a. Therefore, when the FP electrode 12 is provided, compared to the case where the FP electrode 12 is not provided, the distance between the n−-type drift region 1 and the gate electrode 10 in the first direction D1 is longer. Also, by providing the FP electrode 12 which is electrically connected to the source pad 22, the gate electrode 10 is shielded from the drain potential by the source potential. Thereby, compared to the case where the FP electrode 12 is not provided, a capacitance $C_{GD}$ between the gate electrode 10 and the drain electrode 11 electrically connected to the n−-type drift region 1 can be reduced. By reducing the capacitance $C_{GD}$, for example, the switching speed of the semiconductor device 100 can be increased; and the switching loss can be reduced.

Although the source pad 22 may be arranged with the gate interconnect layer 21 in the second direction D2 or the third direction D3, it is favorable for the source pad 22 to be provided on the gate interconnect layer 21 with the second insulating layer 32 interposed. According to this structure, the disposition and the size of the source pad 22 are not limited by the disposition and the size of the gate interconnect layer 21. Therefore, the surface area of the source pad 22 can be wider. For example, when connecting the semiconductor device 100 to an external device, the connection of the interconnect to the source pad 22 is easy.

As illustrated in FIG. 3, it is favorable for the first connector 41 to be provided between the gate electrode 10 and the gate interconnect layer 21 in the first direction D1. According to this structure, compared to the case where the first connector 41 is drawn out to a region other than the region between the gate electrode 10 and the gate interconnect layer 21, the electrical resistance between the gate electrode 10 and the gate interconnect layer 21 can be reduced. When the electrical resistance between the gate electrode 10 and the gate interconnect layer 21 is reduced, for example, the transmission of the signal to the gate electrode 10 is faster. Thereby, the switching speed of the semiconductor device 100 can be increased; and the switching loss can be reduced.

It is favorable for the second connector 42 to be provided between the FP electrode 12 and the source pad 22 in the first direction D1. According to this structure, compared to the case where the second connector 42 is drawn out to a region other than the region between the FP electrode 12 and the source pad 22, the electrical resistance between the FP electrode 12 and the source pad 22 can be reduced.

For example, when the semiconductor device 100 is switched from the ON-state to the OFF-state and the potential of the drain electrode 11 has increased, there are cases where a current flows from the n$^-$-type drift region 1 toward the FP electrode 12 via the insulating portion 30. If the potential of the FP electrode 12 increases due to the flow of the current, the spreading of the depletion layer due to the potential difference between the FP electrode 12 and the n$^-$-type drift region 1 is temporarily small. The breakdown voltage of the semiconductor device 100 decreases if the spreading of the depletion layer is small.

When the electrical resistance between the FP electrode 12 and the source pad 22 decreases, the fluctuation of the potential of the FP electrode 12 when a current flows from the n$^-$-type drift region 1 toward the FP electrode 12 can be suppressed. Therefore, the decrease of the breakdown voltage due to the fluctuation of the potential of the FP electrode 12 can be suppressed.

In the semiconductor device 100 as illustrated in FIG. 2, one gate interconnect layer 21 is provided on two gate electrodes 10 next to each other in the third direction D3. Therefore, a distance Di1 between the gate interconnect layers 21 next to each other in the third direction D3 is longer than a distance Dig between the FP electrodes 12 next to each other in the third direction D3. For example, a pitch Pi1 of the gate interconnect layers 21 in a direction perpendicular to the first direction D1 and the second direction D2 is the same as a pitch Pi2 of the gate electrodes 10 in the perpendicular direction.

According to this structure, the number of the gate interconnect layers 21 necessary for the electrical connections to the multiple gate electrodes 10 arranged in the third direction D3 can be reduced. The surface area where the third connectors 43 can be disposed increases as the number of the gate interconnect layers 21 decreases. Therefore, the electrical resistance between the metal-including portion 20 and the source pad 22 can be reduced; and the avalanche capability can be improved further.

The distance between multiple components corresponds to the shortest length of line segments connecting any point on one component and any point on another component. The pitch Pi1 is calculated using the center of the gate interconnect layer 21 in the perpendicular direction as a reference. The pitch Pi2 is calculated using the center of the gate electrode 10 in the perpendicular direction as a reference.

In the semiconductor device 100 as illustrated in FIG. 2, multiple structure bodies ST which include the gate electrode 10, the FP electrode 12, and the insulating portion 30 are arranged in a staggered configuration. For example, the multiple structure bodies ST include a structure body ST1, and a structure body ST2 next to the structure body ST1 in the third direction D3. The position in the second direction D2 of the gate electrode 10 (a first gate electrode) of the structure body ST1 is different from the position in the second direction D2 of the gate electrode 10 (a second gate electrode) of the structure body ST2. According to this structure, the width of the n$^-$-type drift region 1 positioned between the structure bodies ST can be more uniform. Thereby, the n$^-$-type drift region 1 can be depleted more uniformly between the structure bodies ST; and the breakdown voltage of the semiconductor device 100 can be increased.

In the example of FIG. 2, the configuration of the structure body ST when viewed from the first direction D1 is a hexagon. The multiple structure bodies ST are arranged in a honeycomb configuration to be most dense in a plane perpendicular to the first direction D1. By arranging the structure bodies ST having the regular hexagonal configurations most densely, the width of the n$^-$-type drift region 1 positioned between the structure bodies ST can be more uniform. The breakdown voltage of the semiconductor device 100 can be increased further thereby.

As an example of a specific structure, the structure body ST1 has a center C1 in the second direction D2. The center C1 also is the center of the gate electrode 10 and the FP electrode 12 of the structure body ST1. The structure body ST2 has a center C2 in the second direction D2. The center C2 also is the center of the gate electrode 10 and the FP electrode 12 of the structure body ST2. The structure bodies ST are arranged at a pitch Pi3 in the second direction D2. The structure bodies ST are arranged at a pitch Pi4 in the third direction D3. The pitches Pi3 and Pi4 are calculated respectively using the centers of the structure bodies ST in the second direction D2 and the third direction D3 as references. The pitch Pi3 is the same as the pitch Pi4. The position in the second direction D2 of the center C1 is shifted half of the pitch Pi3 from the position in the second direction D2 of the center C2.

It is favorable for the upper surface of a portion of the metal-including portion 20 positioned under the gate interconnect layer 21 to be positioned higher than the upper surface of the n$^+$-type source region 3. According to this structure, the length in the first direction D1 of the metal-including portion 20 can be longer; and the electrical resistance of the metal-including portion 20 can be reduced. Thereby, the avalanche capability can be improved further; and the ON-resistance can be reduced further.

First Modification

Figure 9:
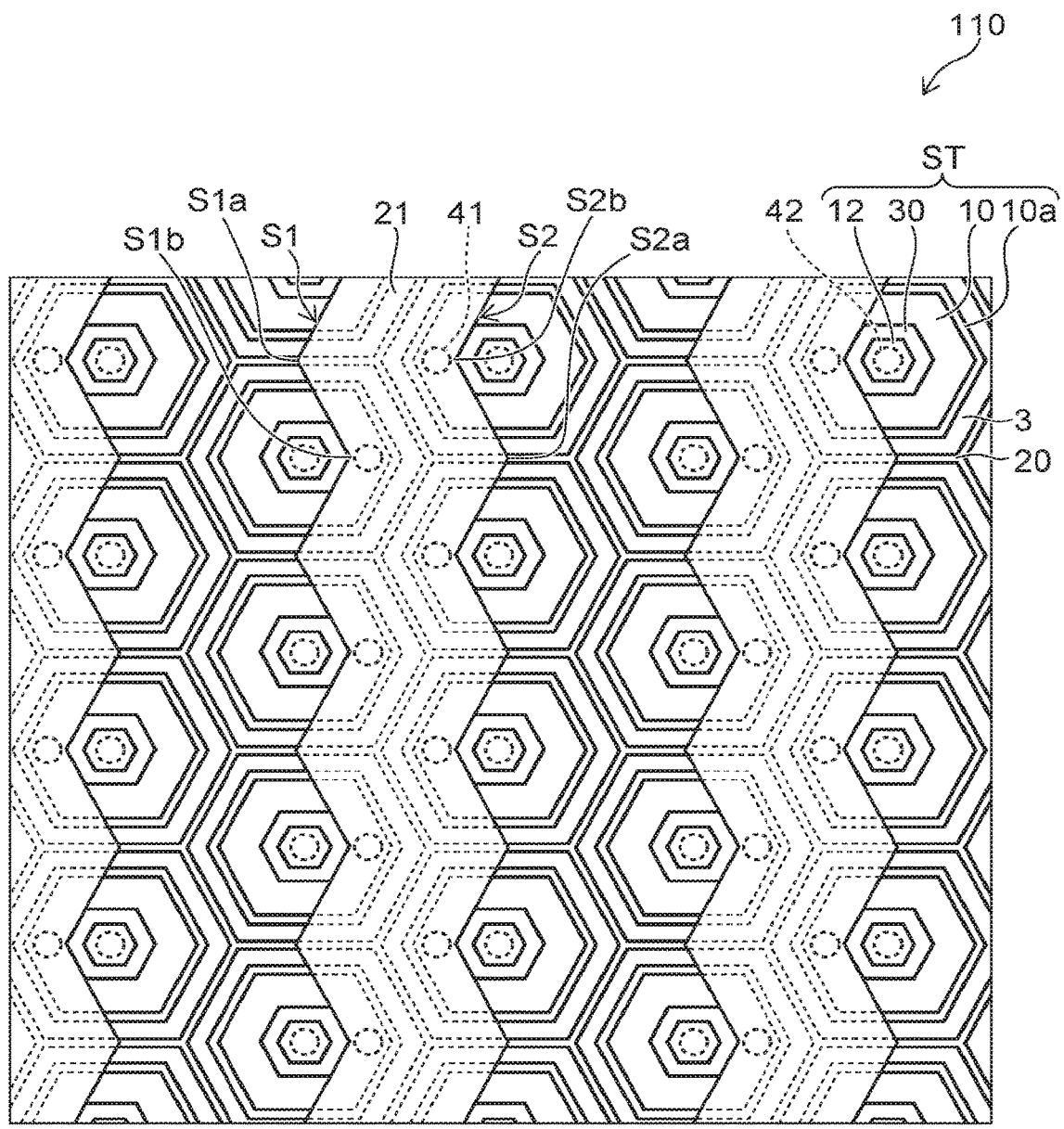
FIG. 9 is a plan view illustrating a portion of a semiconductor device according to a first modification of the first embodiment.
Figure 9:
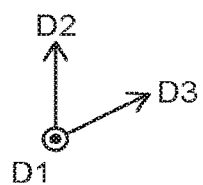

FIG. 9 is a plan view illustrating a portion of a semiconductor device according to a first modification of the first embodiment.

The configuration of the gate interconnect layer 21 of the semiconductor device 110 illustrated in FIG. 9 is different from that of the semiconductor device 100. In the semiconductor device 100, the gate interconnect layer 21 is bent to be aligned with portions of the gate electrodes 10.

Specifically, the gate interconnect layer 21 has a first side surface S1 and a second side surface S2. The second side surface S2 is positioned at the side opposite to the first side surface S1. The first side surface S1 includes a first top portion S1a and a first bottom portion S1b. The second side surface S2 includes a second top portion S2a and a second bottom portion S2b. The first top portion S1a and the second top portion S2a are positioned on the metal-including portion 20. The first bottom portion S1b and the second bottom portion S2b each are positioned on the gate electrode 10 or on the insulating portion 30 between the gate electrode 10 and the FP electrode 12. The first top portion S1a is arranged with the second bottom portion S2b in a direction perpendicular to the first direction D1 and the second direction D2. The first bottom portion S1b is arranged with the second top portion S2a in the perpendicular direction.

For example, the distance in the perpendicular direction between the first top portion S1a and the second bottom portion S2b is the same as the distance in the perpendicular direction between the first bottom portion S1b and the second top portion S2a. The position in the perpendicular direction of the first bottom portion S1b is between the position in the perpendicular direction of the first top portion S1a and the position in the perpendicular direction of the second bottom portion S2b. The position in the perpendicular direction of the second bottom portion S2b is between the position in the perpendicular direction of the first bottom portion S1b and the position in the perpendicular direction of the second top portion S2a.

According to the semiconductor device 110, the opposing surface area of the gate interconnect layer 21 and the gate electrodes 10 can be large because the gate interconnect layer 21 is bent to be aligned with portions of the gate electrodes 10. Therefore, the connection between the gate interconnect layer 21 and the gate electrodes 10 is easy. For example, when the position of the first connector 41 is shifted from the designed position, the likelihood of connection defects occurring between the gate interconnect layer 21 and the gate electrode 10 can be reduced. Or, the surface area of the first connector 41 connected to the gate interconnect layer 21 and the gate electrode 10 can be increased; and the electrical resistance between the gate interconnect layer 21 (the gate pad 24) and the gate electrode 10 can be reduced. Thereby, the switching speed of the semiconductor device 100 can be increased; and the switching loss can be reduced.

Second Modification

Figure 10:
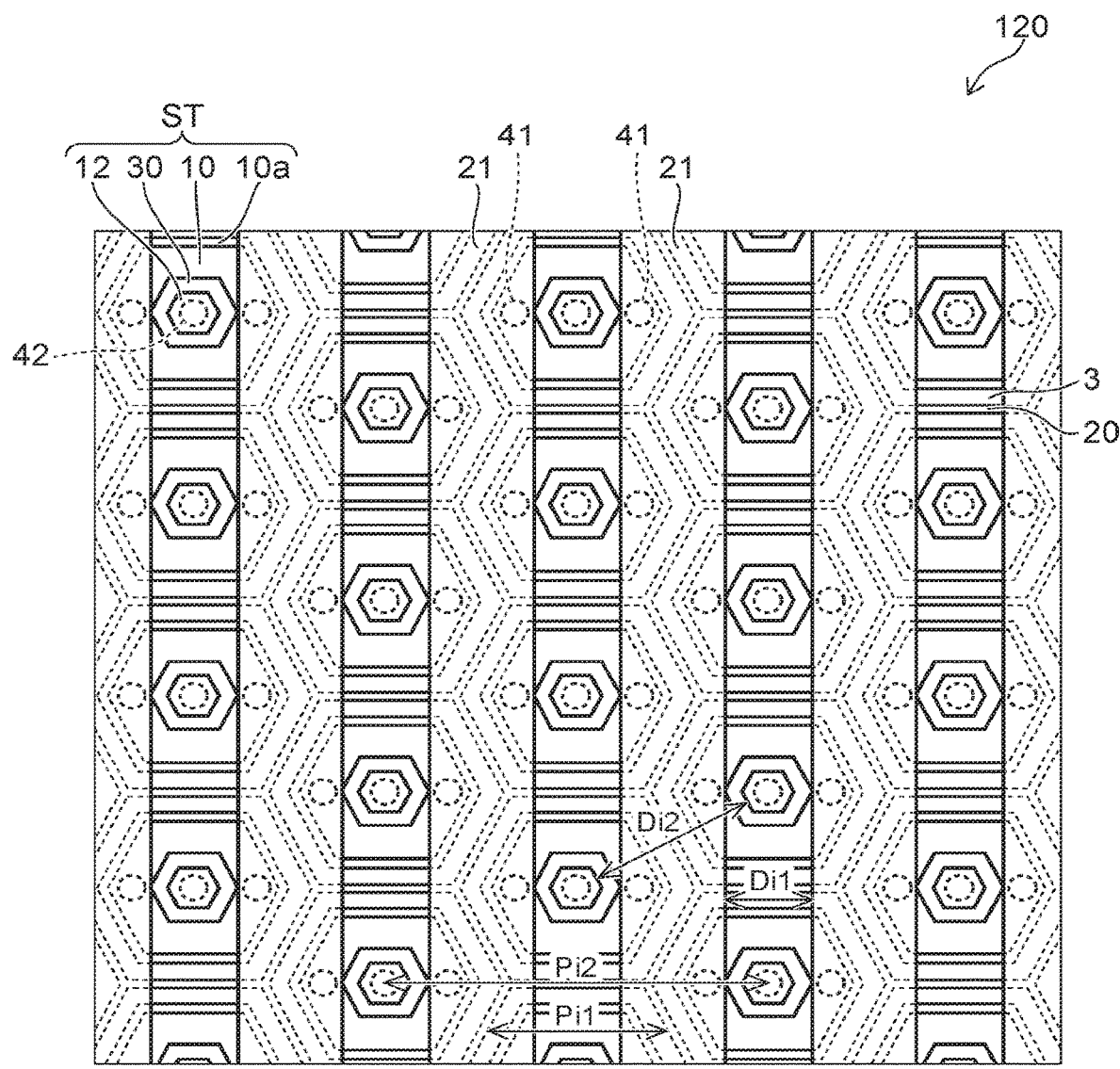
FIG. 10 is a plan view illustrating a portion of a semiconductor device according to a second modification of the first embodiment.

FIG. 10 is a plan view illustrating a portion of a semiconductor device according to a second modification of the first embodiment.

In the semiconductor device 120 illustrated in FIG. 10, compared to the semiconductor devices 100 and 110, more of the gate interconnect layers 21 are provided.

Specifically, the distance Di1 between the gate interconnect layers 21 next to each other in the third direction D3 is shorter than the distance Dig between the FP electrodes 12 next to each other in the third direction D3. The pitch Pi1 of the gate interconnect layers 21 in a direction perpendicular to the first direction D1 and the second direction D2 is half of the pitch Pit of the gate electrodes 10 in the perpendicular direction.

According to the semiconductor device 120, compared to the semiconductor device 100, the electrical resistance between the gate pad 24 and the gate electrodes 10 can be reduced. Thereby, compared to the semiconductor device 100, the switching speed can be increased; and the switching loss can be reduced.

Third Modification

Figure 11:
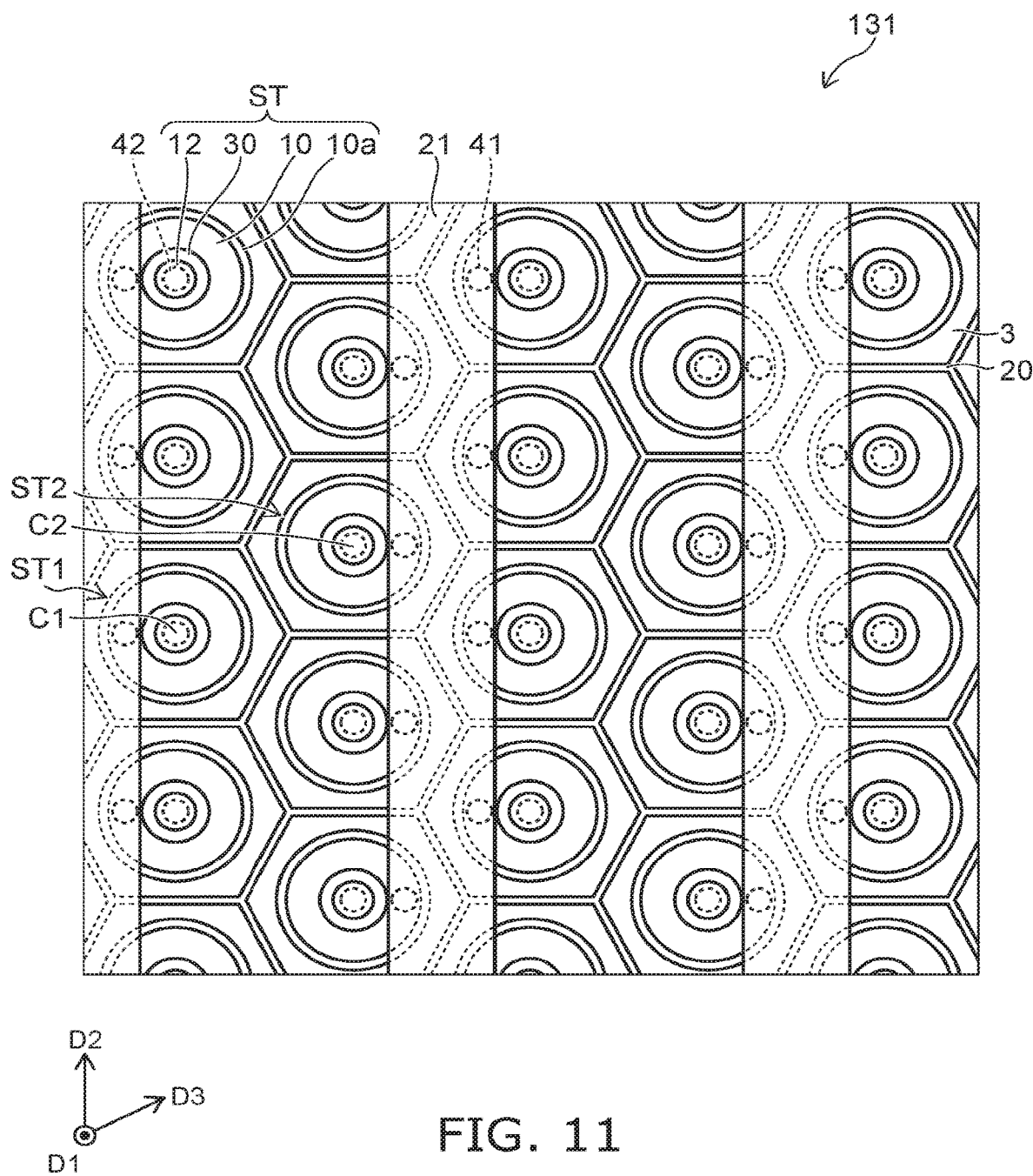
FIG. 11 is a plan view illustrating a portion of a semiconductor device according to a third modification of the first embodiment.
Figure 12:
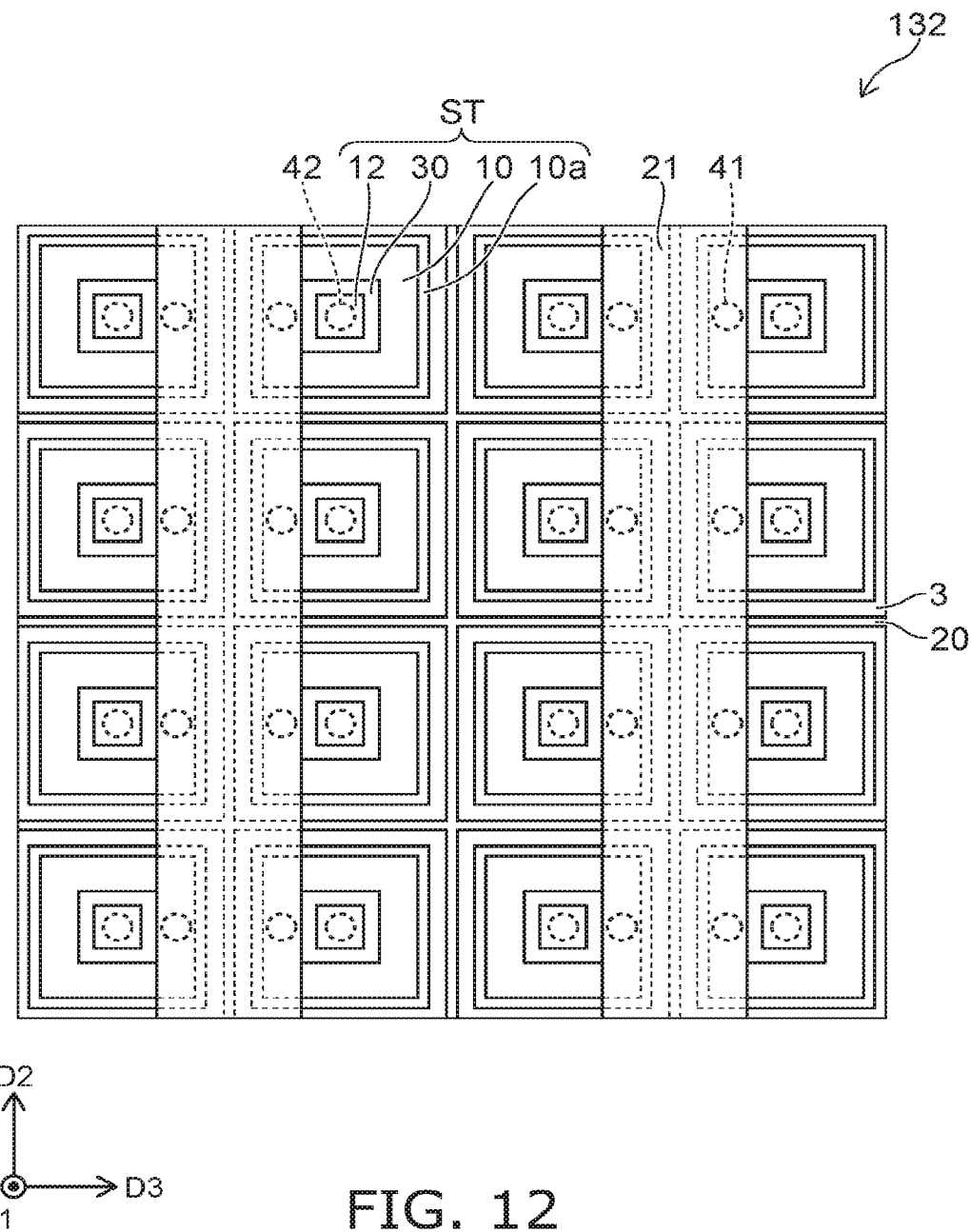
FIG. 12 is a plan view illustrating a portion of a semiconductor device according to a third modification of the first embodiment.

FIG. 11 and FIG. 12 are plan views illustrating portions of semiconductor devices according to a third modification of the first embodiment.

In a semiconductor device 131 illustrated in FIG. 11, the configuration of the structure body ST including the gate electrode 10, the FP electrode 12, and the insulating portion 30 is a circle when viewed from the first direction D1. In a semiconductor device 132 illustrated in FIG. 12, the configuration of the structure body ST is a quadrilateral when viewed from the first direction D1. Also, in the semiconductor device 132, multiple structure bodies ST are provided in the second direction D2 and the third direction D3 which are orthogonal to each other. Or, in the semiconductor device 131, the configuration of the structure body ST may be a quadrilateral when viewed from the first direction D1. In the semiconductor device 132, the configuration of the structure body ST may be a circle when viewed from the first direction D1.

Thus, the configurations and the arrangements of the gate electrode 10, the FP electrode 12, and the insulating portion 30 are modifiable as appropriate. In each embodiment, a portion of the metal-including portion 20 is provided under the gate interconnect layer 21. The avalanche capability of the semiconductor device can be improved thereby.

Fourth Modification

Figure 13:
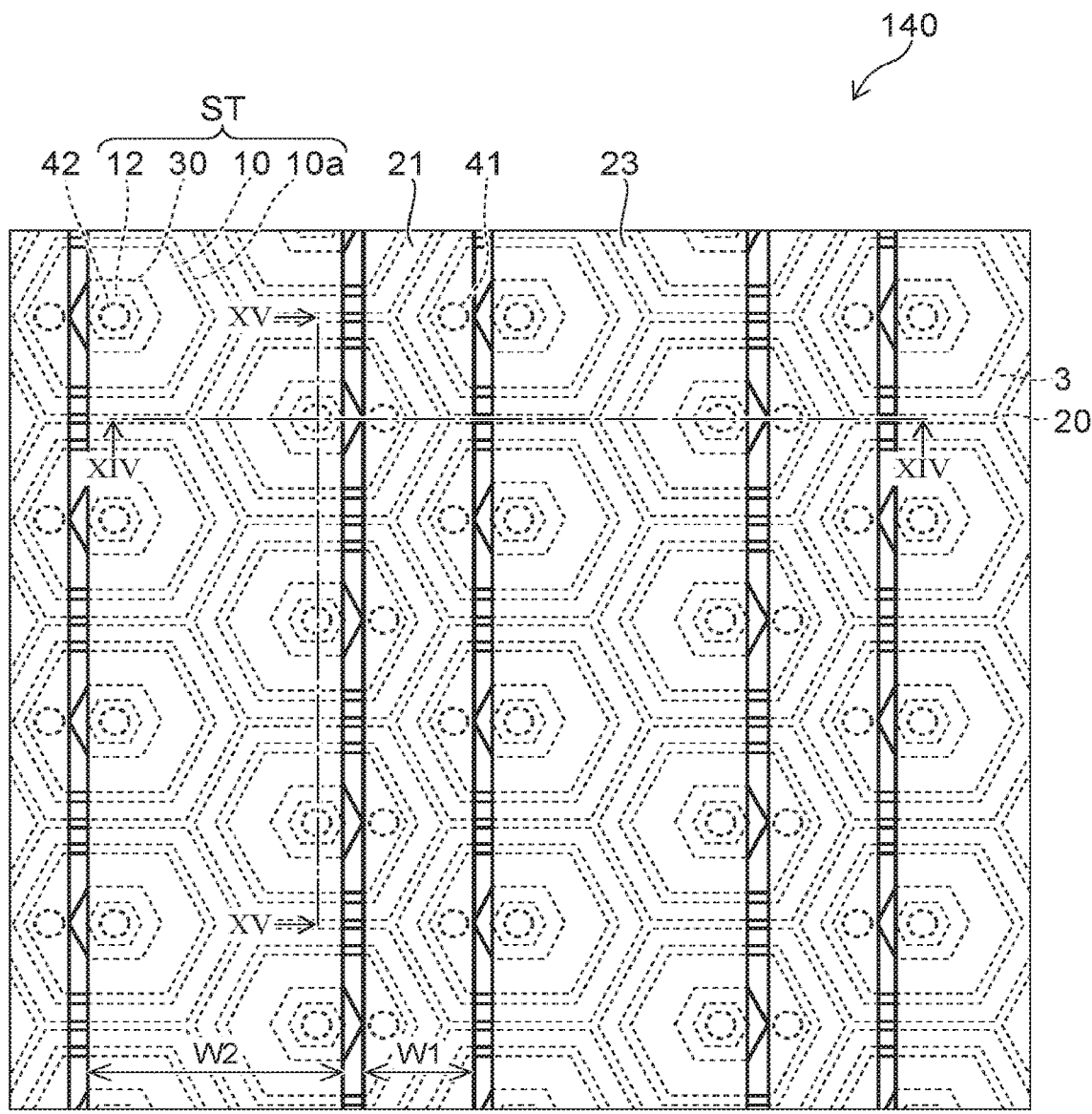
FIG. 13 is a plan view illustrating a portion of a semiconductor device according to a fourth modification of the first embodiment.

FIG. 13 is a plan view illustrating a portion of a semiconductor device according to a fourth modification of the first embodiment.

Figure 14:
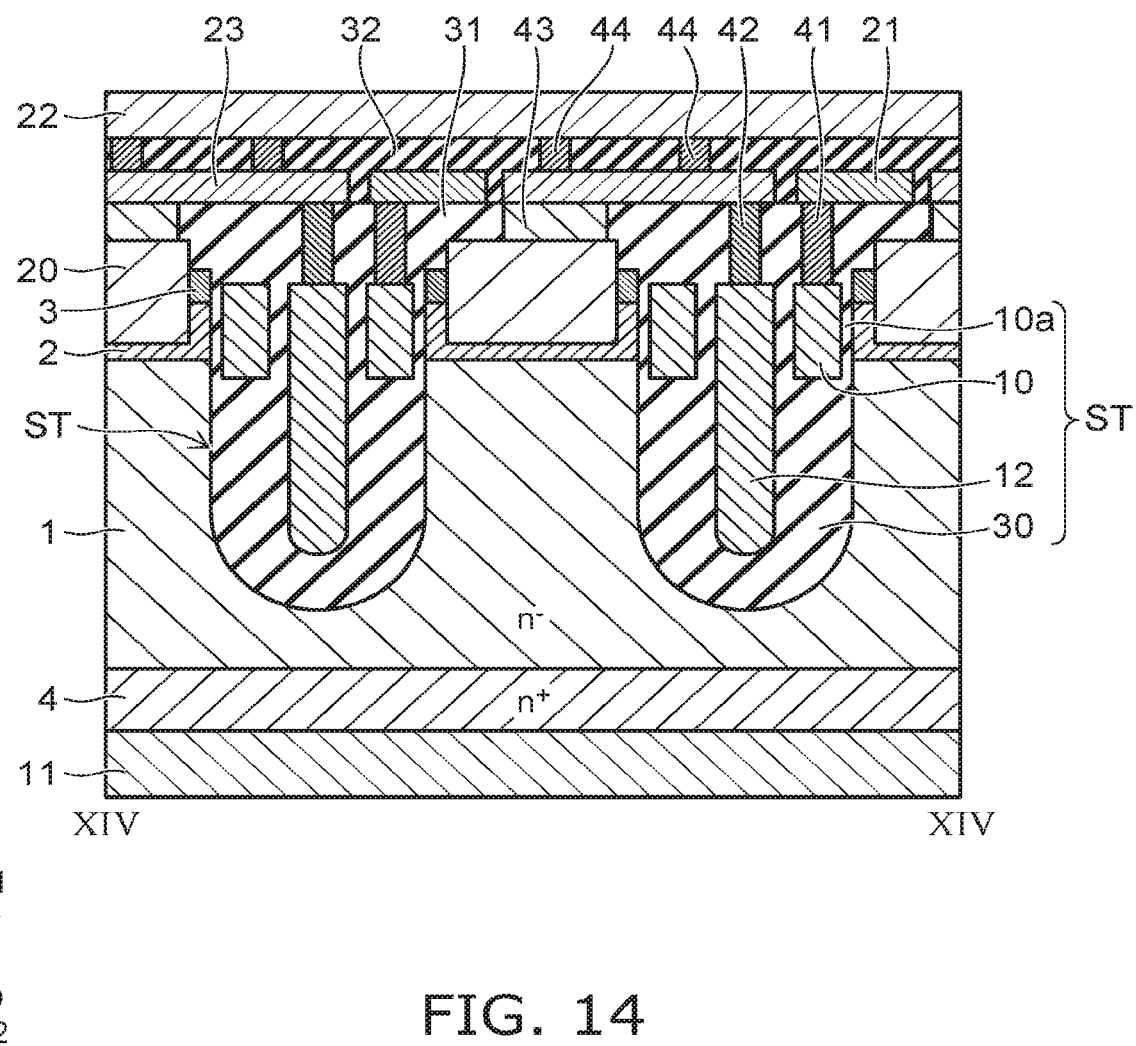
FIG. 14 is a XIV-XIV cross-sectional view of FIG. 13.
Figure 15:
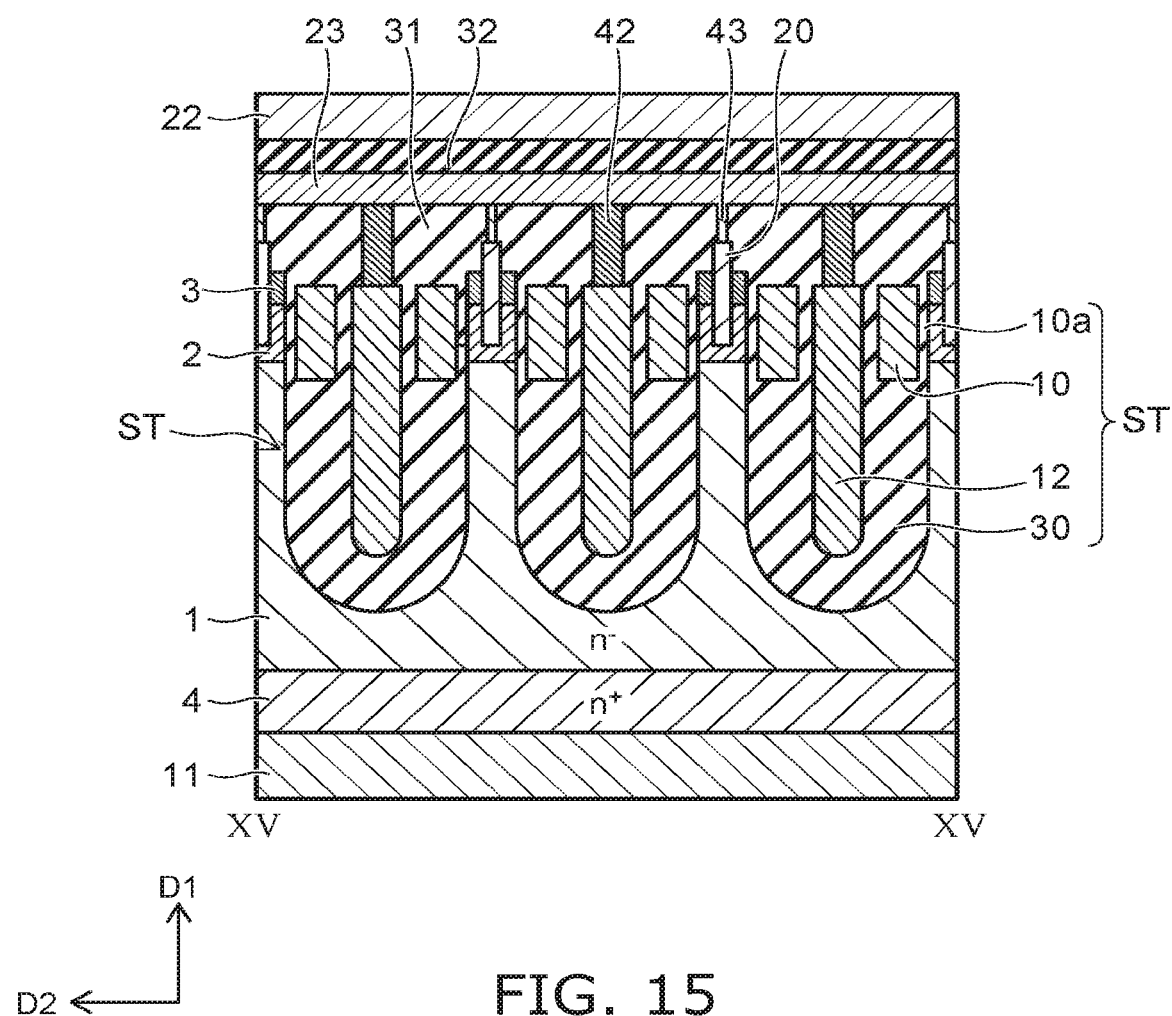
FIG. 15 is a XV-XV cross-sectional view of FIG. 13

FIG. 14 is a XIV-XIV cross-sectional view of FIG. 13.
FIG. 15 is a XV-XV cross-sectional view of FIG. 13.

The semiconductor device 140 according to the fourth modification further includes a source interconnect layer 23 (a third interconnect layer) and a connector 44 as illustrated in FIG. 13 to FIG. 15.

The source interconnect layer 23 is provided on the metal-including portion 20 and the FP electrode 12 with the first insulating layer 31 interposed. The source interconnect layer 23 is arranged with the gate interconnect layer 21 in the third direction D3.

The second connector 42 is provided between the FP electrode 12 and the source interconnect layer 23; and the FP electrode 12 and the source interconnect layer 23 are electrically connected. The third connector 43 is provided between the metal-including portion 20 and the source interconnect layer 23; and the metal-including portion 20 and the source interconnect layer 23 are electrically connected.

The connector 44 is provided between the source interconnect layer 23 and the source pad 22; and the source interconnect layer 23 and the source pad 22 are electrically connected. In other words, the FP electrode 12 and the metal-including portion 20 are electrically connected to the source pad 22 via the second connector 42, the third connector 43, the source interconnect layer 23, and the connector 44.

For example, multiple source interconnect layers 23 are provided in the third direction D3 and extend in the second direction D2. The multiple gate interconnect layers 21 and the multiple source interconnect layers 23 are provided alternately in the third direction D3.

By providing the source interconnect layer 23, compared to the semiconductor device 100, the lengths in the Z-direction of the second connector 42 and the third connector 43 can be short. Therefore, it is easy to make the second connector 42 and the third connector 43; for example, the yield of the semiconductor device 140 can be increased.

When forming the insulating layer IL5 corresponding to the second insulating layer 32 in the manufacturing processes of the semiconductor device 100, the position of the upper surface of the insulating layer IL5 on the gate interconnect layer 21 is higher than the position of the upper surface of the insulating layer IL5 other than on the gate interconnect layer 21. For example, planarization is performed after forming the insulating layer IL5. However, the flatness after processing degrades when the fluctuation of the position of the upper surface of the insulating layer IL5 is large.

Contact holes respectively for forming the second connector 42 and the third connector 43 are formed in the insulating layer IL5. The formation of these contact holes includes photolithography. In the photolithography before exposing, for example, the focal length is detected by irradiating light from an oblique direction onto the front surface of the patterning object and by measuring the reflected light. As recited above, when the fluctuation of the position of the upper surface of the insulating layer IL5 is large, defocus occurs; and the focal length cannot be detected accurately. As a result, the upper surface of the insulating layer IL5 is not focused on appropriately when exposing; and the photoresist cannot be patterned correctly. As a result, misalignment, size fluctuation, etc., of the second connector 42 and the third connector 43 occur; fluctuation of the characteristics between the semiconductor devices occurs; and the yield of the semiconductor device decreases.

By providing the source interconnect layer 23, the difference can be small between the position of the upper surface of the insulating layer IL5 on the gate interconnect layer 21 and the position of the upper surface of the insulating layer IL5 other than on the gate interconnect layer 21. As a result, the flatness of the upper surface of the insulating layer IL5 can be improved. By improving the flatness, for example, the precision of the focus in the photolithography can be increased. As a result, the characteristic fluctuation between the semiconductor devices described above can be reduced; and the yield can be increased.

For example, a length W2 of the source interconnect layer 23 in a direction perpendicular to the first direction D1 and the second direction D2 is longer than a length W1 of the gate interconnect layer 21 in the perpendicular direction. The electrical resistance of the source interconnect layer 23 can be reduced thereby. By reducing the electrical resistance of the source interconnect layer 23, the electrical resistance when discharging the holes to the source pad 22 is reduced; and the avalanche capability can be improved further.

Second Embodiment

Figure 16:
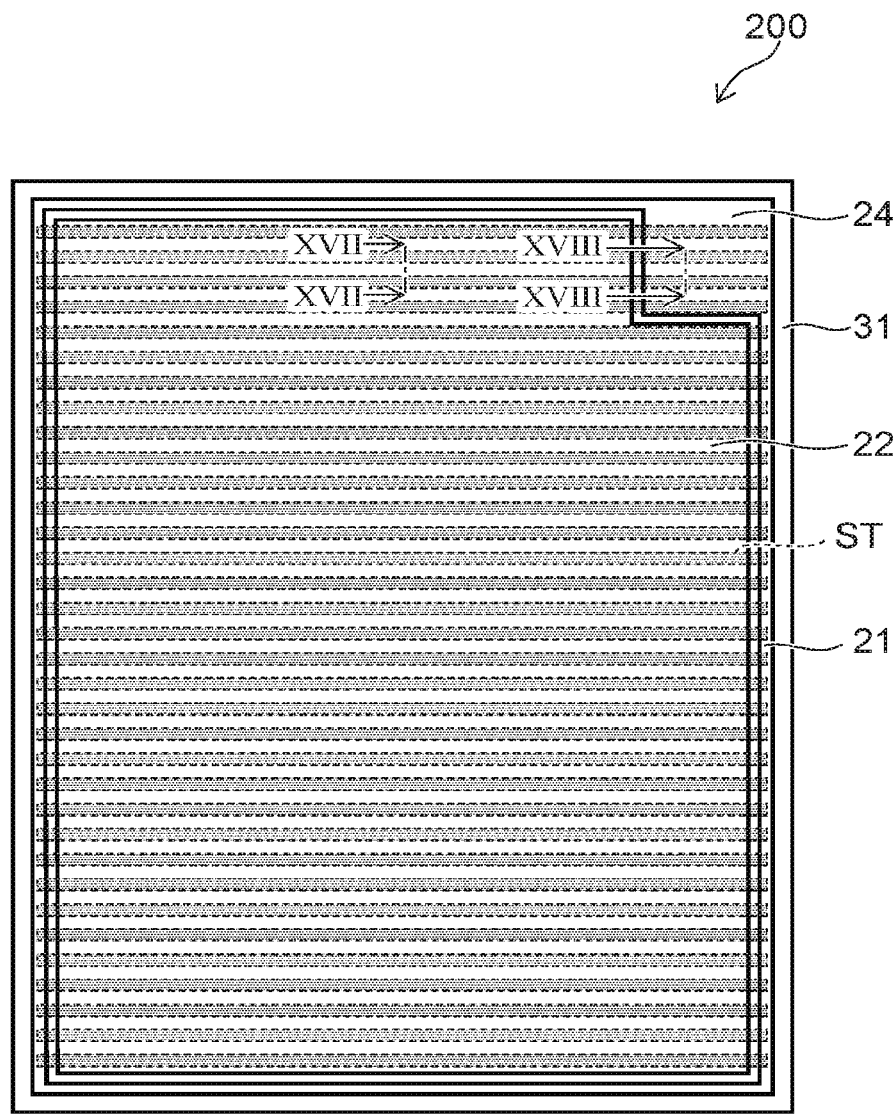
FIG. 16 is a plan view illustrating a semiconductor device according to a second embodiment.
Figure 16:
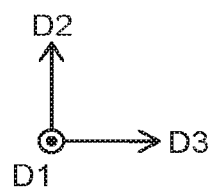

FIG. 16 is a plan view illustrating a semiconductor device according to a second embodiment. In FIG. 16, the positions of the structure bodies ST including the gate electrode 10, the FP electrode 12, and the insulating portion 30 are marked with dots.

Figure 17:
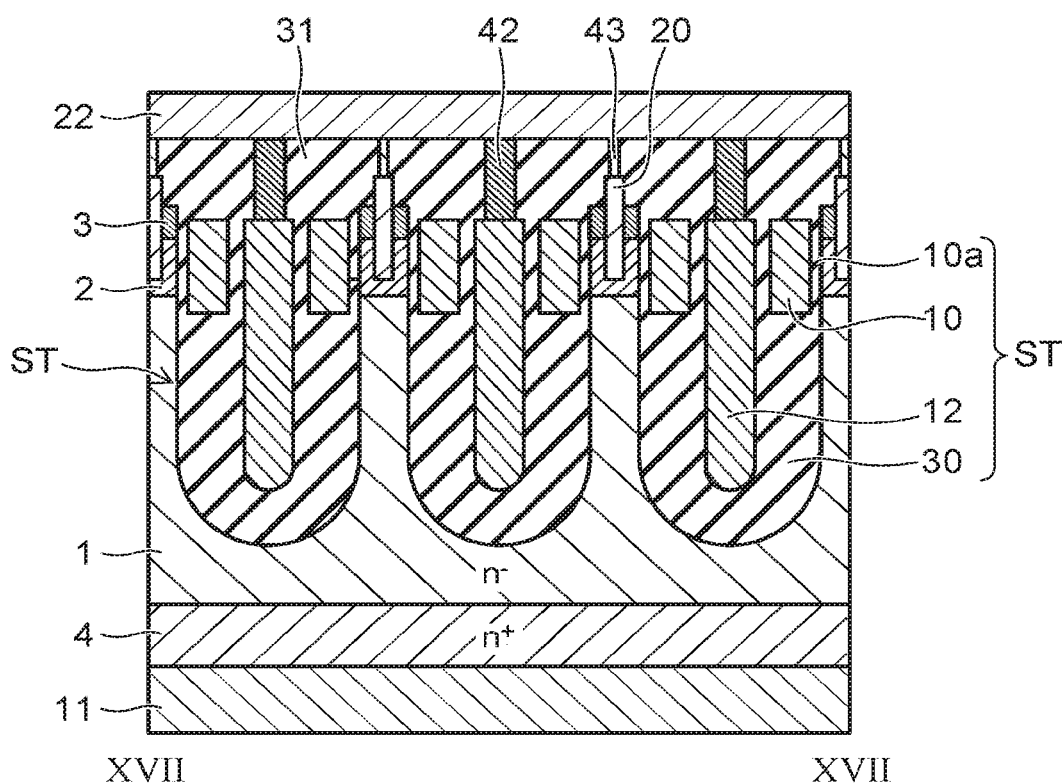
FIG. 17 is a XVII-XVII cross-sectional view of FIG. 16.
Figure 17:
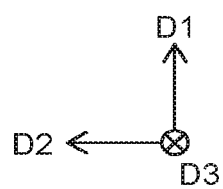
Figure 18:
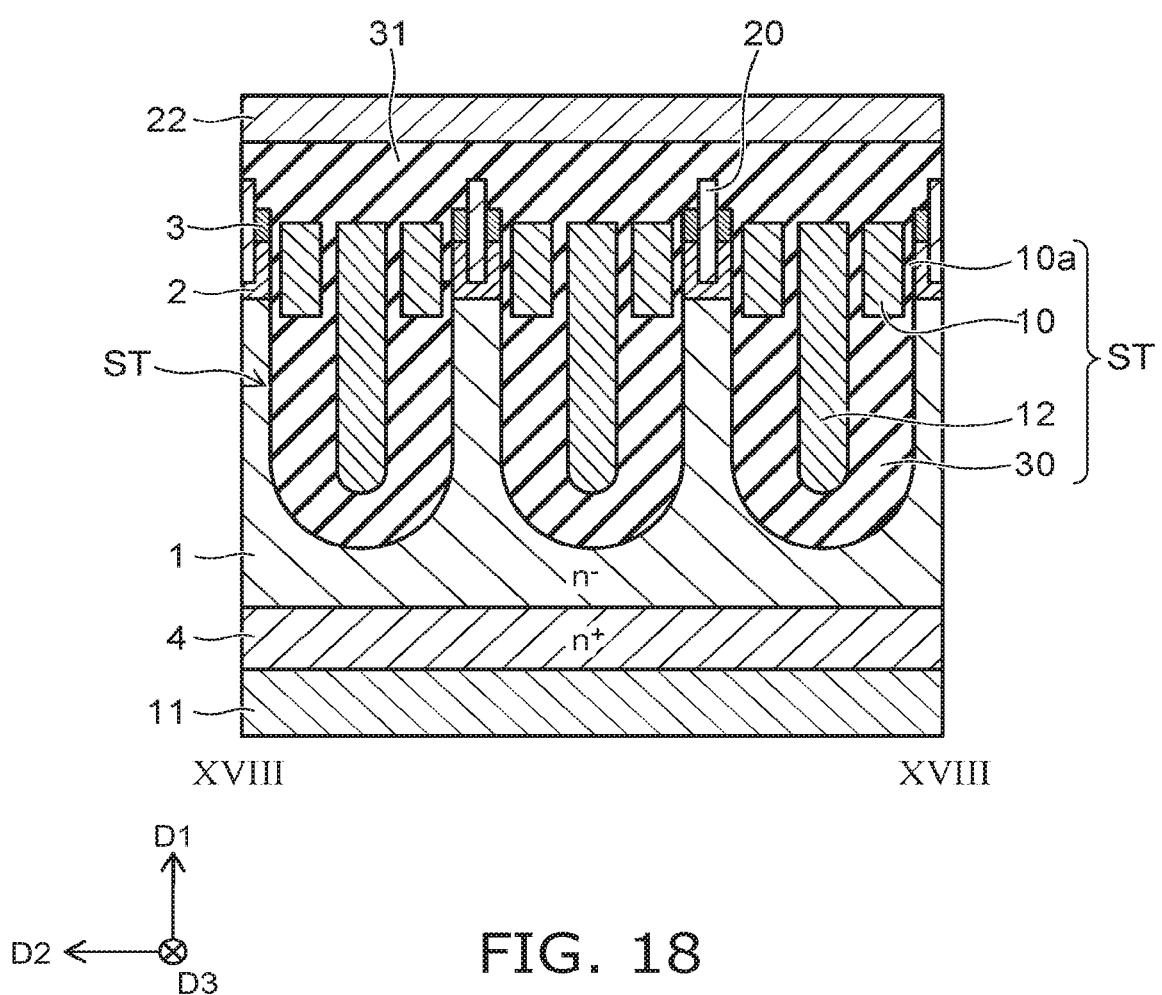
FIG. 18 is a XVIII-XVIII cross-sectional view of FIG. 16.

FIG. 17 is a XVII-XVII cross-sectional view of FIG. 16. FIG. 18 is a XVIII-XVIII cross-sectional view of FIG. 16.

The semiconductor device 200 according to the second embodiment is, for example, a MOSFET. As illustrated in FIG. 16 to FIG. 18, the semiconductor device 200 according to the second embodiment includes the n$^-$-type drift region 1 (the first semiconductor region), the p-type base region 2 (the second semiconductor region), the n$^+$-type source region 3 (the third semiconductor region), the n$^+$-type drain region 4, the gate electrode 10, the drain electrode 11 (the first electrode), the FP electrode 12 (the second electrode), the metal-including portion 20, the source pad 22 (the second interconnect layer), the gate pad 24 (the first interconnect layer), the insulating portion 30, the first insulating layer 31, the second connector 42, and the third connector 43.

In the semiconductor device 200 as illustrated in FIG. 16, multiple structure bodies ST which include the gate electrode 10, the FP electrode 12, and the insulating portion 30 are provided in the second direction D2 and extend in the third direction D3 perpendicular to the first direction D1 and the second direction D2. At least one structure body ST is provided under both the source pad 22 and the gate pad 24. For example, a portion of the one structure body ST is provided under the source pad 22; and another portion of the one structure body ST is provided under the gate pad 24.

FIG. 17 illustrates portions of two structure bodies ST provided under the source pad 22. FIG. 18 illustrates other portions of the two structure bodies ST provided under the gate pad 24. As illustrated in FIG. 17 and FIG. 18, the p-type base region 2, the n$^+$-type source region 3, the insulating portion 30, the gate electrode 10, and the FP electrode 12 are provided under the source pad 22 and the gate pad 24. The second connector 42 and the third connector 43 are provided under the source pad 22. The second connector 42 connects the FP electrode 12 and the source pad 22. The third connector 43 connects the metal-including portion 20 and the source pad 22. The source pad 22 and the gate pad 24 are provided on the p-type base region 2, the n$^+$-type source region 3, and the metal-including portion 20 with the first insulating layer 31 interposed.

As illustrated in FIG. 16, the gate interconnect layer 21 that surrounds the source pad 22 is connected to the gate pad 24. The gate interconnect layer 21 is connected to the end portion in the third direction D3 of the gate electrode 10. Therefore, in the semiconductor device 200, the first connector 41 for electrically connecting the gate electrode 10 and the gate pad 24 is not provided. However, the first connector 41 for connecting the gate electrode 10 and the gate pad 24 may be provided between the gate electrode 10 and the gate pad 24.

The operations of the semiconductor device 200 are similar to those of the semiconductor device 100. When a voltage that is not less than a threshold is applied to the gate electrode 10 in a state in which a voltage that is positive with respect to the source pad 22 is applied to the drain electrode 11, the semiconductor device 100 is set to the ON-state. At this time, a channel is formed in the p-type base region 2 also in the region under the gate pad 24. The electrons flow mainly via the metal-including portion 20 from the source pad 22 toward the region under the gate pad 24, and flow toward the drain electrode 11 via the channel.

In the semiconductor device 200, a portion of the carriers generated when avalanche breakdown occurs flow toward the p-type base region 2 under the gate pad 24. The holes that flow toward the p-type base region 2 under the gate pad 24 are discharged to the source pad 22 via the third connector 43 provided under the source pad 22. Accordingly, the potential of the p-type base region 2 under the gate pad 24 increases easily compared to the potential of the p-type base region 2 under the third connector 43.

For this problem, in the semiconductor device 200, the metal-including portion 20 is provided not only under the third connector 43 but also under the gate pad 24. Therefore, the electrical resistance until the holes flowing toward the p-type base region 2 under the gate pad 24 are discharged to the source pad 22 can be reduced. Accordingly, according to the second embodiment, similarly to the first embodiment, the avalanche capability can be improved. Also, when the electrical resistance in the region under the gate pad 24 is reduced by the metal-including portion 20, the ON-resistance of the semiconductor device 200 also can be reduced. The current density of the semiconductor device 200 can be increased thereby.

Favorable aspects of the semiconductor device according to the first embodiment are applicable as appropriate also to the semiconductor device according to the second embodiment. For example, it is favorable for the second connector 42 to be provided between the FP electrode 12 and the source pad 22 in the first direction D1. Also, the upper surface of a portion of the metal-including portion 20 positioned under the gate pad 24 is positioned higher than the upper surface of the $n^+$-type source region 3.

In each of the embodiments described above, it is possible to confirm the relative levels of the impurity concentrations between the semiconductor regions by using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. It is also possible to measure the impurity concentration in each semiconductor region by, for example, SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:
1. A semiconductor device, comprising:
a first electrode;
a first semiconductor region provided on the first electrode and electrically connected to the first electrode, the first semiconductor region being of a first conductivity type;
a second semiconductor region provided on the first semiconductor region, the second semiconductor region being of a second conductivity type;
a third semiconductor region provided on a portion of the second semiconductor region, the third semiconductor region being of the first conductivity type;
a metal-including portion provided on an other portion of the second semiconductor region, the metal-including portion being electrically conductive;
an insulating portion arranged in a second direction with the third semiconductor region, the second semiconductor region, and a portion of the first semiconductor region, the second direction being perpendicular to a first direction from the first electrode toward the first semiconductor region;
a gate electrode provided inside the insulating portion, the gate electrode opposing the second semiconductor region in the second direction with a gate insulating layer interposed;
a second electrode provided inside the insulating portion and electrically isolated from the gate electrode, the second electrode including a portion opposing the first semiconductor region in the second direction;
a first interconnect layer electrically connected to the gate electrode and provided, with a first insulating layer interposed, on the gate electrode and a portion of the metal-including portion; and
a second interconnect layer provided to be separated from the first interconnect layer and electrically connected to the metal-including portion and the second electrode.

2. The device according to claim 1, wherein
pluralities are provided in the second direction for the insulating portion, the gate electrode, and the second electrode, and
the first interconnect layer is electrically connected to the plurality of gate electrodes and provided on the plurality of gate electrodes with the first insulating layer interposed.

3. The device according to claim 1, wherein the second interconnect layer is provided on the first interconnect layer with a second insulating layer interposed.

4. The device according to claim 3, further comprising:
a first connector connecting the first interconnect layer and the gate electrode and being provided between the gate electrode and the first interconnect layer in the first direction; and
a second connector connecting the second interconnect layer and the second electrode and being provided between the second electrode and the second interconnect layer in the first direction.

5. The device according to claim 3, further comprising a third interconnect layer provided, with the first insulating layer interposed, on the second electrode and an other portion of the metal-including portion,
the third interconnect layer being arranged with the first interconnect layer in a third direction,
the third direction being perpendicular to the first direction and crossing the second direction,
the third interconnect layer being electrically connected to the second electrode, the metal-including portion, and the second interconnect layer.

6. The device according to claim 1, wherein
pluralities are provided in a third direction for the insulating portion, the gate electrode, the second electrode, and the first interconnect layer, the third direction being perpendicular to the first direction and crossing the second direction, and
each of the plurality of first interconnect layers is provided on the plurality of gate electrodes and electrically connected to the plurality of gate electrodes.

7. The device according to claim 6, further comprising a third connector connecting the metal-including portion and the second interconnect layer,
the third connector being provided between the first interconnect layers in the third direction.

8. The device according to claim 6, wherein one of the first interconnect layers is provided on two of the gate electrodes next to each other in the third direction.

9. The device according to claim 6, wherein a distance between the first interconnect layers next to each other in the third direction is longer than a distance between the second electrodes next to each other in the third direction.

10. The device according to claim 6, wherein
the plurality of gate electrodes includes a first gate electrode, and a second gate electrode next to the first gate electrode in the third direction, and a position in the second direction of the first gate electrode is different from a position in the second direction of the second gate electrode.

11. The device according to claim 1, wherein an upper surface of the portion of the metal-including portion is positioned higher than an upper surface of the third semiconductor region.

12. The device according to claim 1, wherein
the second semiconductor region, the third semiconductor region, the metal-including portion, the insulating portion, the gate electrode, and the second electrode extend in a third direction, the third direction being perpendicular to the first direction and crossing the second direction,
a third interconnect layer is provided on a portion of each of the second semiconductor region, the third semiconductor region, the metal-including portion, the insulating portion, the gate electrode, and the second electrode, and
the second interconnect layer is provided on an other portion of each of the second semiconductor region, the third semiconductor region, the metal-including portion, the insulating portion, the gate electrode, and the second electrode.

13. The device according to claim 1, wherein the metal-including portion includes at least one selected from the group consisting of aluminum, tungsten, copper, titanium, cobalt, and nickel.

* * * * *